United States Patent [19]

Hisamori et al.

[11] Patent Number: 5,631,643
[45] Date of Patent: May 20, 1997

[54] KEY-CODE OUTPUTTING APPARATUS FOR DATA PROCESSOR HAVING AN INTERCHANGEABLE KEYBOARD

[75] Inventors: Takashi Hisamori, Inagi; Shigeo Shiratori, Kawasaki, both of Japan

[73] Assignee: Fujitsu Limited, Japan

[21] Appl. No.: 504,497

[22] Filed: Jul. 20, 1995

[30] Foreign Application Priority Data

Jul. 20, 1994 [JP] Japan .................. 6-167880
Jul. 17, 1995 [JP] Japan .................. 7-180425

[51] Int. Cl.$^6$ .................. H03K 17/94; H03M 11/00
[52] U.S. Cl. .................. 341/23; 341/20; 341/28; 345/168; 345/171; 364/188
[58] Field of Search .................. 400/110; 345/168, 345/171; 235/145 R, 146; 364/188, 189; 341/20, 22, 23, 28

[56] References Cited

U.S. PATENT DOCUMENTS

| | | | |
|---|---|---|---|
| 4,122,533 | 10/1978 | Kubinak | 364/900 |
| 4,124,843 | 11/1978 | Bramson et al. | 340/337 |
| 4,531,119 | 7/1985 | Nakayama et al. | 341/28 |
| 4,544,276 | 10/1985 | Horodeck | 341/28 |
| 4,737,040 | 4/1988 | Moon | 341/28 |
| 5,214,421 | 5/1993 | Vernon et al. | 235/146 |
| 5,387,042 | 2/1995 | Brown | 345/171 |

FOREIGN PATENT DOCUMENTS 57-159328  10/1982  Japan .

Primary Examiner—Thomas Mullen
Assistant Examiner—Timothy Edwards, Jr.
Attorney, Agent, or Firm—Staas & Halsey

[57] ABSTRACT

This invention provides a key-code outputting apparatus for a data processor of the type wherein two or more kinds of characters are assigned to each key of a keyboard connected to the data processor, and different kinds of characters can be inputted from one key by using a character input mode or by using conjointly a function key and a shift key. The key-code outputting apparatus includes a memory for managing a correspondence for each character input mode so that a key-code generated by a key address of the same character inputted from a keyboard of a different kind becomes the same as a key-code generated by the key address inputted from a keyboard having a key arrangement assumed by a data processing program. The key-code outputting apparatus judges the kind of the keyboard, then judges the character input mode used by the data processing program, reads out the key-code in the key arrangement assumed by the data processing program and indicated by the key address inputted from the keyboard on the basis of the judgement result and the correspondence and outputs it to the data processing program. As a result, a correct key-code can be applied to the data processing program even when the key arrangement of the keyboard connected to the data processor is different from the key arrangement assumed by the data processing program inside the data processor.

28 Claims, 16 Drawing Sheets

Fig. 1C
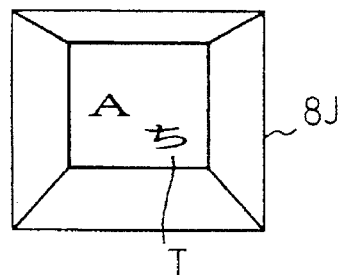
Fig. 1D
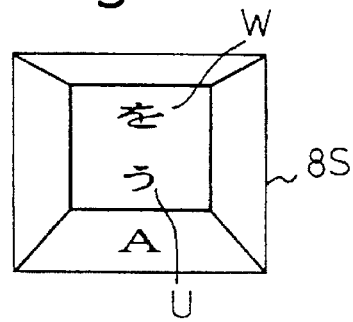
Fig. 1E

Fig. 3A
| KEY | OUTPUT CODE |
|---|---|
| A / う | 41 |
| ） | ） |
24
Fig. 3B
| KEY | OUTPUT CODE |
|---|---|
| A / う | 34 |
| ） | ） |
23S
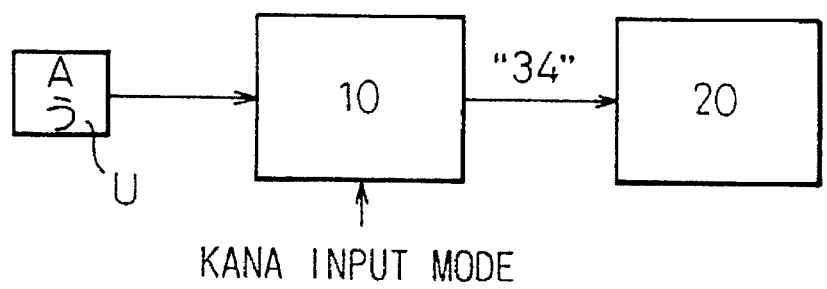
Fig. 4A
KANA INPUT MODE
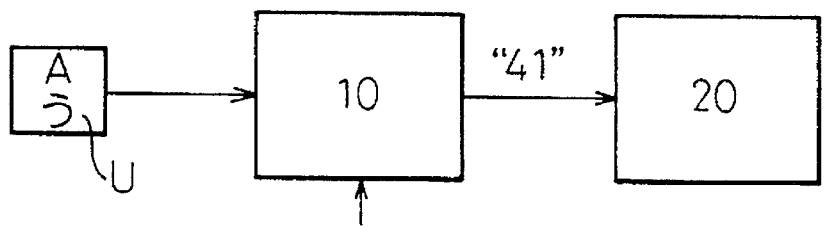
Fig. 4B
ALPHABET INPUT MODE

Fig.5A

| SHIFT/UNSHIFT | KEY | OUTPUT CODE | 23A |
|---|---|---|---|
| UNSHIFT | ; | 3B | |
| | ⟨ | ⟨ | |
| SHIFT | : | 0E, 3B | |
| | ⟨ | ⟨ | |

Fig.5B

| KEY | OUTPUT· CODE | 231 |
|---|---|---|
| ; | 3B | |
| : | 0E, 3B | |
| ⟨ | ⟨ | |

ALPHABET UNSHIFT INPUT MODE

ALPHABET SHIFT INPUT MODE

Fig. 7

| KEY | OUTPUT CODE | |
|---|---|---|
| 1 | 12, 31, 11 | ~23S |
| ) | ) | |

Fig. 8

| CONDITION | KEY | OUTPUT CODE | |
|---|---|---|---|
| ON | 1 | 12, 92, 31 | ~23S |
| | ) | ) | |
| OFF | 1 | B1, 11, 91 | |
| | ) | ) | |
| CONTINUOUS ON | 1 | INTERRUPTED OUTPUT OF 31 | |
| | ) | ) | |

Fig.10A
| KEY | OUTPUT CODE |
|---|---|
| ALPHABET SHIFT OFF | 11, 91 |
| ALPHABET SHIFT ON | 12, 92 |
24
Fig.10B
| KEY | OUTPUT CODE |
|---|---|
| ALPHABET SHIFT ON | 12, 92 |
| ALPHABET SHIFT OFF | 11, 91 |
23S
Fig.11A
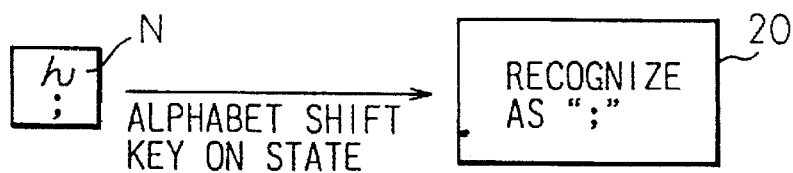
Fig.11B
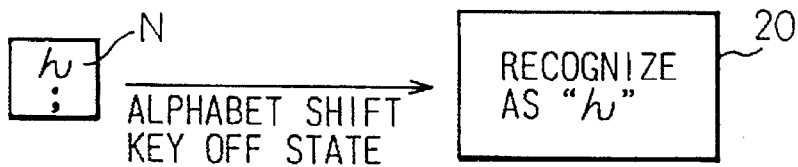

| あ | か | さ | た | な | は | ま | や | ら | わ | ん |
|---|---|---|---|---|---|---|---|---|---|---|
| い | き | し | ち | に | ひ | み |   | り | ゐ |   |
| う | く | す | つ | ぬ | ふ | む | ゆ | る |   |   |
| え | け | せ | て | ね | ひ | み |   | れ | ゑ |   |
| お | こ | そ | と | の | ほ | も | よ | ろ | を |   |

| ア | カ | サ | タ | ナ | ハ | マ | ヤ | ラ | ワ | ン |
|---|---|---|---|---|---|---|---|---|---|---|
| イ | キ | シ | チ | ニ | ヒ | ミ |   | リ | キ |   |
| ウ | ク | ス | ツ | ヌ | フ | ム | ユ | ル |   |   |
| エ | ケ | セ | テ | ネ | ヒ | ミ |   | レ | ヱ |   |
| オ | コ | ソ | ト | ノ | ホ | モ | ヨ | ロ | ヲ |   |

| A | KA | SA | TA | NA | HA | MA | YA | RA | WA | N |
|---|---|---|---|---|---|---|---|---|---|---|
| I | KI | SI | TI | NI | HI | MI |   | RI | YI |   |
| U | KU | SU | TU | NU | HU | MU | YU | RU |   |   |
| E | KE | SE | TE | NE | HE | ME |   | RE | YE |   |
| O | KO | SO | TO | NO | HO | MO | YO | RO | WO |   |

KEY-CODE OUTPUTTING APPARATUS FOR DATA PROCESSOR HAVING AN INTERCHANGEABLE KEYBOARD

BACKGROUND OF THE INVENTION

1. Field of the Invention

The present invention relates to a key-code outputting apparatus of a data processor equipped with a keyboard. More particularly, the present invention relates to a key-code outputting apparatus of a data processor equipped with a keyboard, which can provide a correct key-code, required by a data processor, to a data processing program even when a key arrangement of the keyboard connected to the data processor is different from the key arrangement of the keyboard assumed by the data processing program of the data processor.

2. Description of the Related Art

Keyboards have been used generally as an input devices of data processors. However, the key arrangement of the keyboards has not yet been unified completely, and various keyboards having different key arrangements have been put on the market. For example, keyboards having an ISO (International Organization for Standardization) arrangement and keyboards having an ANSI arrangement have spread in U.S.A. Nonetheless, the keyboards of the ANSI (American National Institute, Inc.) arrangement have been more popular than the keyboards of the ISO arrangement in U.S.A.

FIG. 1A shows the broad construction of the data processor 1 to which a keyboard 4A of the ANSI arrangement is connected. The keyboard 4A of the ANSI arrangement is connected to the data processor by a connector 1C. The data processor 1 includes a keyboard driver 6. Data inputted from the keyboard 4A is transmitted to an application program (data processing program) 20 through this keyboard driver 6. A display device 5 is connected to the data processor 1, and display data from the application program 20 is stored in a screen code buffer 21 as a display memory and is then outputted to the display device 5.

A keyboard is provided in most cases as a fitting to a data processor such as a personal computer at the time of shipment. In such cases, no problem occurs because the key arrangement of the keyboard is coincident with the key arrangement assumed by a data processing program of the data processor. On the other hand, there is the case where the key arrangement of a keyboard added to the data processor is different from the key arrangement of the keyboard the user usually uses. In such a case, the user removes the keyboard provided with the data processor from it and after connecting the keyboard having the key arrangement familiar to him, the user inputs data to the data processor. Then, quite naturally, the key arrangement assumed by the data processing program is different from the key arrangement of the keyboard, and the data processing program of the data processor receives meaningless input data and cannot execute data processing.

Accordingly, for example, a key-code conversion apparatus for converting the key-code generated by the keyboard of the ISO arrangement to the key-code of the ANSI arrangement has been provided so that the data processing program generated on the assumption of the keyboard of the ANSI arrangement can be operated by the keyboard of the ISO arrangement, too.

FIG. 1B shows a data processor having a keyboard interchanging function according to the prior art, and like reference numerals are used to identify the same constituent members as those of the data processor explained with reference to FIG. 1A. The keyboard 4A of the ANSI arrangement and the keyboard 4I of the ISO arrangement can be interchanged by the connector 1C. A keyboard driver 6I for the ISO arrangement and the keyboard driver 6A for the ANSI arrangement are disposed in parallel inside the data processor 1, and one of them can be selected by a switch 7.

Note that the switch 7, the keyboard driver 6I for the ISO arrangement and the keyboard driver 6A for the ANSI arrangement correspond to the key-code conversion apparatus.

Although a large number of key arrangements other than the ISO arrangement and the ANSI arrangement of the keyboards that can be used in U.S.A. exist, a key-code conversion apparatus for handling the key arrangements other than the ANSI arrangement and the ISO arrangement have not been available as as key-code conversion apparatus for the data processor equipped with a conventional keyboard.

By the way, it is necessary for the key-code conversion apparatus for converting the difference of the key arrangements on the keyboard to correctly grasp a character input mode used by the data processing program of the data processor and to execute the key-code conversion processing. The character input mode represents the mode for inputting the data of the keyboard by characters other than the alphabet. In Japan, for example, a kana character input mode such as hiragana and katakana other than the alphabet exists, and the kana character is displayed in the mixed state with the alphabet on the key top of each key of the keyboard by means such as printing.

The Japanese writing system utilizes four different kinds of symbols: (1) kanji, (2) katakana, (3) hiragana, and (4) romaji. Kanji is a set of ideographs principally borrowed from classic Chinese characters. Both katakana and hiragana are Japanese original syllabaries invented in the eighth or ninth century based on Chinese characters. They differ in orthographical form, but have a syllabary of 48 letters each as shown in FIGS. 19A and 19B. Hiragana corresponds to an alphabet in Japanese language. Katakana also corresponds to an alphabet in Japanese language and is especially used for a word of foreign origin. Romaji is an alphabet of 28 Roman letters and the same phonetic sound of katakana and hiragana can be realized by the combination of 28 Roman letters as shown in FIG. 19C. Since the number of kanji is several thousand, Japanese language is input to a computer or a Japanese word processor by using a hiragana-assigned keyboard and hiragana displayed on the screen of the computer or the Japanese word processor is converted to kanji or katakana by touching a conversion key on the keyboard. Katakana may be directly displayed on the screen of the computer or the Japanese word processor by using the hiragana-assigned keyboard if the input mode is katakana-input-mode.

For example, in the JIS (Japanese Industrial Standards) arrangement keyboard conforming to the ISO arrangement in Japan, the alphabet "A" and a hiragana character shown by the alphabet T (pronunciation is "chi") are assigned to a certain key (key top) 8J as shown in FIG. 1C. When the key 8J having "A" and the character shown by the alphabet T assigned thereto is touched, the JIS arrangement keyboard generates a key-code "41", for example, irrespective of the kana input mode/alphabet input mode, and this key-code "41" is inputted to the data processor. When the data input device receives this key-code "41", the data processing program recognizes the key-code as the character shown by the alphabet T in the kana input mode and recognizes it as "A" in the alphabet input mode.

A keyboard equipped with a thumb shift key and referred to as a "thumb shift arrangement keyboard" is also available in Japan. As shown in FIG. 1D, three kinds of characters, that is, the alphabet "A" and two hiragana characters shown by the alphabet W (pronunciation is "WO") and the alphabet U (pronunciation is "U"), are assigned to a certain key 8S of the thumb shift arrangement keyboard. In this thumb shift arrangement keyboard, when this key alone is touched in the kana input mode, a key-code corresponding to the hiragana character shown by the alphabet U is outputted and when this key is simultaneously touched with the thumb shift key in the kana input mode, a key-code corresponding to the hiragana character shown by the alphabet W is outputted. When this key is individually touched in the alphabet input mode, a key-code corresponding to the alphabet "A" is outputted.

As described above, the data processing program recognizes the character input mode and executes recognition processing of the key-code generated by the keyboard. Therefore, when the key-code outputting apparatus is constituted, a construction must be employed such that the key-code outputting apparatus can correctly grasp the character input mode recognized by the data processing program.

Set processing of the character input mode is generally carried out by the push-down operation of the alphabet/kana key disposed on the keyboard. When the key-code outputting apparatus is constituted, therefore, it may be possible to employ a construction which monitors the character input mode recognized by the data processing program by monitoring the key operation of the alphabet/kana character key.

When such a construction is employed, however, there is the case where the character input mode recognized by the key-code outputting apparatus is not transmitted to the data processing program due to bit fall-off, etc. In such a case, the character input mode recognized by the key-code outputting apparatus becomes different from the character input mode recognized by the data processing program. Further, when the kind of characters to be printed is determined in advance in accordance with the positions on a slip to be printed such as when characters and figures are printed on a slip having frames printed thereon before-hand, there is the case where the data processing program changes arbitrarily the character input mode when the printing position changes.

FIG. 1E shows the screen display of the display device 5 when an address book is inputted by the data processor. When the address book is inputted, the character input mode automatically changes to the alphabet input mode in the fields F1 and F4 for inputting the postal code and the telephone number even when the operator does not change the character input mode, and the character input mode automatically changes similarly to the kana input mode in the fields F2 and F4 for inputting the address and the name.

As described above, when the character input mode recognized by the operator becomes different from the character input mode recognized by the data processing program of the data processor, the key-code outputting apparatus wrongly grasps the character input mode used by the data processing program, so that the data processing program cannot receive the correct key-code.

For example, even though the character input mode changes from the kana input mode to the alphabet input mode and yet the operator still recognizes the character input mode as the kana input mode, the kana characters the operator desires to input are not recognized by the data processing program, and the alphabet assigned to the key touched by the operator is inputted.

SUMMARY OF THE INVENTION

The object of the present invention is to provide a novel key-code outputting apparatus for a data processor equipped with a keyboard that can apply a correct key-code required by a data processing program to the data processing program when the key arrangement of the keyboard is different from the key arrangement assumed by the data processing program in the data processor having an interchangeable keyboard.

According to the first aspect of the present invention, there is provided a key-code outputting apparatus for outputting a key information from a keyboard to a data processing means as a key-code, the keyboard having a plurality of different character input mode and a key arrangement of the keyboard is different from a key arrangement assumed by the data processing means of a data processor, comprising: keyboard kind judging means for judging the kind of key arrangement of the keyboard presently used; character input mode detection means for detecting the present character input mode set to the data processor; corresponding code memory means for storing the key information of the keyboard and the key-code corresponding to the key information in the key arrangement assumed by the data processing means in a predetermined character input mode with a corresponding form; and key-code generation means for generating a key-code corresponding to the key information from the keyboard referring to the corresponding code memory when the detected present character input mode is the predetermined character input mode.

By the way, the key-code outputting apparatus may be disposed either on the data processor side or on the keyboard side. When the key-code outputting apparatus is disposed on the keyboard side, the key-code outputting apparatus receives the key address generated by the keyboard and outputs it to the data processor.

According to the second aspect of the present invention, there is provided a key-code outputting apparatus for outputting a key information from a keyboard to a data processing means as a key-code, a key arrangement of the keyboard is different from a key arrangement assumed by the data processing means of a data processor and the key information outputted from the keyboard by touching a key to input a certain character is corresponding to a key information outputted by touching a different key having a different key-position and a shift key at the same time in the key arrangement assumed by the data processing means, comprising: keyboard kind judgement means for judging the kind of the key arrangement of the keyboard connected at present to the data processor; shift mode detection means for detecting whether the keyboard connected to the data processor is in a shift mode or an unshifted mode; and key-code memory means disposed for the keyboard assumed by the data processing means, for storing the key-code so outputted as to the key information at the time when the key is touched under the unshift state, in an unshift region, and for storing the key-code so outputted as to correspond to the key information at the time when the key is touched under the shift state as the combination of the key-code outputted when the same key is under the unshift state with the key-code representing the shift, in the shift region.

By the way, when the data processor is equipped with the display device in the key-code outputting apparatus of the first and second aspects of the invention, the detection means can detect the character input mode or the shift mode by looking up the code information of the specific region of the display memory for storing the display data to be displayed on the display device which code information represents the character input mode or the shift mode, or can detect the character input mode or the shift mode in accordance with the command content of a change command whenever the change command of the code information displaying the character input mode or the shift mode in the display memory for storing the display data to be displayed on the display device is generated.

According to the third aspect of the present invention, there is provided a key-code outputting apparatus for outputting a key information from a keyboard to a data processing means as a key-code, the keyboard having a plurality of different character input mode, a key arrangement of the keyboard is different from a key arrangement assumed by the data processing means of a data processor, and a specific key is used for inputting the same character in a different character input mode, comprising: keyboard kind judging means for judging the kind of key arrangement of the keyboard presently used; key-code memory means for storing a key-code for changing the present character input mode to a predetermined character input mode wherein the specific key is used in the key arrangement assumed by the data processing means and a key-code generated by the touch of the specific key in the predetermined character input mode, in accordance with the key information outputted from the keyboard by the touch of the specific key; and key-code generation means for outputting a key-code of character indicated by the specific key in the predetermined character input mode and the key-code of the character input mode corresponding to the key information after referring to the key-code memory means in accordance with the received key information.

In this case, the key-code memory means may further store a key-code for returning the character input mode to the original character input mode in succession to the key-code generated when the key having the specific and same kind of character assigned thereto is touched in the character input mode.

According to the fourth aspect of the present invention, there is provided a key-code outputting apparatus for outputting a key information from a keyboard to a data processing means as a key-code, the keyboard having a plurality of different character input mode, a key arrangement of the keyboard is different from a key arrangement assumed by the data processing means of a data processor, and a specific key is used for inputting the same character in a different character input mode, comprising: keyboard kind judging means for judging the kind of key arrangement of the keyboard presently used; first key-code memory means for storing a key-code generated by the touch of a function key for changing the present character input mode to a predetermined character input mode wherein the specific key is used in the key arrangement assumed by the data processing means, a key-code generated by the release of the function key, and a key-code generated by the touch of the specific key in the predetermined character input mode, in accordance with the key information outputted from the keyboard by the touch of the specific key; second key-code memory means for storing a key-code generated by the touch of the function key for changing the present character input mode to a specific character input mode other than predetermined character input mode wherein the specific key is used in the key arrangement assumed by the data processing means and a key-code generated by the touch of the specific key in the predetermined character input mode, in accordance with the key information outputted from the keyboard by the touch of the specific key; and key-code interrupt generation means for interruptedly generating a key-code at a predetermined time interval, and the key-code is generated by the touch of the specific key when the key information showing a on-state of the key is continuously inputted for more than a predetermined time.

According to the fifth aspect of the present invention, there is provided a key-code outputting apparatus for outputting a key information from a keyboard to a data processing means as a key-code, the keyboard having a plurality of different character input mode and a key arrangement of the keyboard is different from a key arrangement assumed by the data processing means of a data processor, comprising: keyboard kind judging means for judging the kind of key arrangement of the keyboard presently used; shift key provided on the keyboard capable of temporarily changing the first character input mode to the second character input mode; first key-code memory means for storing a key-code generated by the touch of the function key for changing the present character input mode to the second character input mode in accordance with the key information showing a touch operation of the shift key and a key-code generated by the release of the function key: and second key-code memory means for storing a key-code generated by the touch of the function key for changing the present character input mode to the first character input mode and a key-code generated when the function key is release, in accordance with the key information showing the release of the shift-key.

According to the key-code outputting apparatus in the first aspect of the present invention, the key-code conversion means looks up the corresponding code memory means and generates the key-code when the key arrangement of the keyboard presently used for the data processor is different from the key arrangement assumed by the data processing program. Therefore, the key-code of the key arrangement of the kind of character assumed by the data processing program on the basic of the key information generated by the keyboard can be generated correctly.

According to the key-code outputting apparatus of the data processor equipped with a keyboard in the second aspect of the present invention, when the keyboard connected at present is the keyboard assumed by the data processing program inside the main body, the key-code conversion means reads out the key-code from the key-code memory means in accordance with the present shift mode, and when the keyboard has a different kind of the key arrangement from that of the keyboard assumed by the data processing program, the key-code conversion means reads out the key-code from the corresponding code memory means. In either case, the key-code conversion means outputs the key-code so read out to the data processing program.

When a keyboard having a key arrangement different from the key arrangement assumed by the data processing program is connected to the data processor and when the specific and same kind of character assigned to a key disposed at the same position on the keyboard is inputted in a different character input mode, the key-code outputting apparatus of the data processor equipped with a keyboard in the third aspect of the present invention employs the construction such that the character input mode is first changed to the character input mode of the key assumed by the data processing program when the key having this specific and same kind of character assigned thereto is touched, the key-code of this key is generated and subsequently, the character input mode is returned to the mode before the change.

When the keyboard having a key arrangement different from the key arrangement assumed by the data processing program is connected and when the specific and same kind of character assigned to the key disposed at the same position on the keyboard is inputted in a different character input mode, the key-code outputting apparatus of the data processor equipped with a keyboard according to the fourth aspect of the present invention generates interruptedly with a predetermined interval the key-code of the specific and same kind of character when the key information representing the ON state of the key having the specific and same kind of character assigned thereto is continuously inputted for at least a predetermined time, in addition to the function of the key-code outputting apparatus of the third aspect.

The key-code outputting apparatus of the data processor equipped with a keyboard according to the fifth aspect of the present invention is provided with the specific shift key capable of temporarily changing the character input mode on the keyboard, and only when this specific shift key is touched, the character input mode is changed to a certain mode.

According to the keyboard of the present invention, it is determined whether or not the character input mode is a romaji conversion mode. Alphabets inputted to the keyboard are treated as romaji and are outputted to the data processor after converted to the hiragana characters in romaji conversion mode. Contrary to this, alphabets inputted to the keyboard are outputted to the data processor without conversion when the character input mode is not the romaji conversion mode.

In some cases, the keyboard connected to the data processor according to the present invention includes detection means for detecting whether or not the operation mode is set to a romaji conversion mode and conversion means for handling the input codes as romaji, converting them to the kana and outputting it to the data processor when the detection means detects that the operation mode is the romaji conversion mode, and for outputting the input alphabet as such to the data processor when the detection means detects that the operation mode is not the romaji conversion mode.

By the way, the term "romaji input mode" represents the mode in which hiragana or katakana is inputted to the data processor by inputting the alphabet on the keyboard. For example, when hiragana as shown in FIG. 19A or katakana as shown in FIG. 19B is going to input, alphabet keys on the keyboard are sequentially pressed in combination as shown in FIG. 19C in romaji input mode.

BRIEF DESCRIPTION OF THE DRAWINGS

The present invention will be more clearly understood from the description as set for the below with reference to the accompanying drawings, wherein:

FIG. 1C is a plan view of a key top and is useful for explaining the kind of characters assigned to one key of a JIS keyboard;

FIG. 1D is a plan view of a key top and is useful for explaining the kind of characters assigned to one key of a thumb shift keyboard;

FIG. 1E is an explanatory view showing a display screen of a display when an address is inputted to the data processor;

FIG. 3A is a data diagram showing an example of management data of an alphabet conversion table in FIG. 2 according to the first embodiment of the present invention;

FIG. 3B is a data diagram showing an example of management data of a kana conversion table in FIG. 2 according to the first embodiment of the present invention;

FIG. 4A is a block diagram useful for explaining the processing of the key-code outputting apparatus in the kana input mode according to the first embodiment of the present invention;

FIG. 4B is a block diagram useful for explaining the processing of the key-code outputting apparatus in the alphabet input mode according to the first embodiment of the present invention;

FIG. 5A is a data diagram showing an example of management data of the alphabet conversion table in FIG. 2 in the second embodiment of the present invention;

FIG. 5B is a data diagram showing an example of management data of the kana conversion table in FIG. 2 in the second embodiment of the present invention;

FIG. 7 is a data diagram showing an example of management data of the kana conversion table in FIG. 2 according to the third embodiment of the present invention;

FIG. 8 is a data diagram showing an example of management data of the kana conversion table in FIG. 2 according to the fourth embodiment of the present invention;

FIG. 10A is a data diagram showing an example of management data of the alphabet conversion table in FIG. 2 according to the fifth embodiment of the present invention;

FIG. 10B is a data diagram showing an example of management data of the kana conversion table in FIG. 2 according to the fifth embodiment of the present invention;

FIG. 11A is a block diagram useful for explaining the recognition state of an application program when the alphabet shift key is turned on, according to the fifth embodiment of the present invention;

FIG. 11B is a block diagram useful for explaining the recognition state of the application program when the alphabet shift key is turned off, according to the fifth embodiment of the present invention;

FIG. 19A is a table showing 48 symbols of hiragana;

FIG. 19B is a table showing 48 symbols of katakana;

FIG. 19C is a table showing romaji corresponding to the hiragana shown in FIG. 19A and katakana shown in FIG. 19B.

DESCRIPTION OF THE PREFERRED EMBODIMENTS

Figure 2:
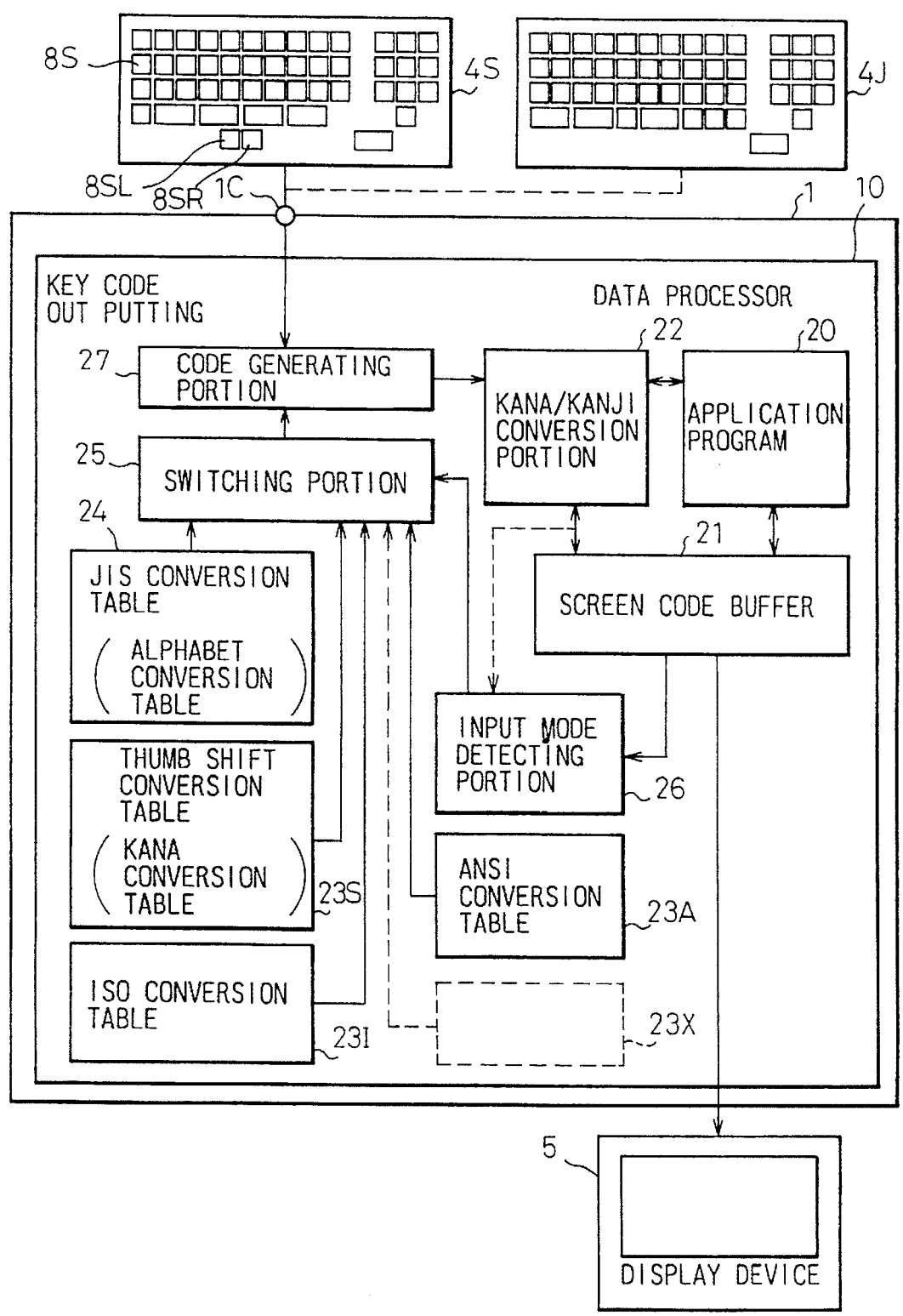
FIG. 2 is a block diagram showing a key-code outputting apparatus of a data processor equipped with a keyboard according to an embodiment of the present invention.

FIG. 2 shows an embodiment of the present invention.

In the drawing, reference numeral 1 denotes a data processor. The data processor 1 includes a key-code outputting apparatus constituted by the present invention, an application program 20 for executing a predetermined data process, a screen code buffer 21 for expanding display data generated by the application program 20, and a kana-kanji conversion portion 22 for executing a kana-kanji conversion function. Reference numeral 4S denotes a key-board provided to the data processor 1. The keyboard 4S generates the address of the key which is touched. Reference numeral 5 denotes a display device provided to the data processor. The display device 5 displays the display data expanded in the screen code buffer 21. The keyboard 4S is connected to the data processor 1 by a connector 1C.

By the way, the keyboard 4S described above is referred to as a "thumb shift arrangement keyboard" in Japan, and two thumb shift keys 8SL and 8SR are disposed at the center of the lower portion of the keyboard 4S. When one of the thumb shift keys 8SL, 8SR and the key 8S are simultaneously touched in of a hiragana mode or in a katakana mode in this keyboard 4S, the upper one of the two characters assigned to the key 8S is inputted. A JIS arrangement keyboard 4J, too, can be connected to this data processor 1 by the connector 1C.

When the keyboard assumed by the application program 20 is the JIS arrangement keyboard 4J, for example, the key-code outputting apparatus 10 of this embodiment has a kana-conversion table for managing correspondence between the key address for the kana characters of the thumb shift arrangement keyboard 4S and the key-codes, an alphabet conversion table 24 for managing correspondence between the key address for the alphabet of the JIS arrangement keyboard and the key-codes, a conversion table 23A for an ANSI keyboard and a conversion table 23I for an ISO keyboard. Further, the key-code outputting apparatus 10 has a conversion table 23X for a keyboard which might be connected thereto. An input device, not shown, can read information of such a keyboard which might be connected in future, into the conversion table 23X for such a keyboard. The conversion table 23X may be supplied as an external memory medium in the form of an add-in ROM, a hard disk or a CDROM.

Further, the key-code outputting apparatus 10 includes a switching portion 25 for executing the switching processing of each conversion table, an input mode detecting portion 26 for detecting the character input mode used by the application program 20 and notifying it to the switching portion 26 and a code generating portion 27 for converting the key address as the key information generated by the connected keyboard to the key-code in accordance with the management data of each table designated by the detection result of the input mode detection portion 26.

Figure 16A:
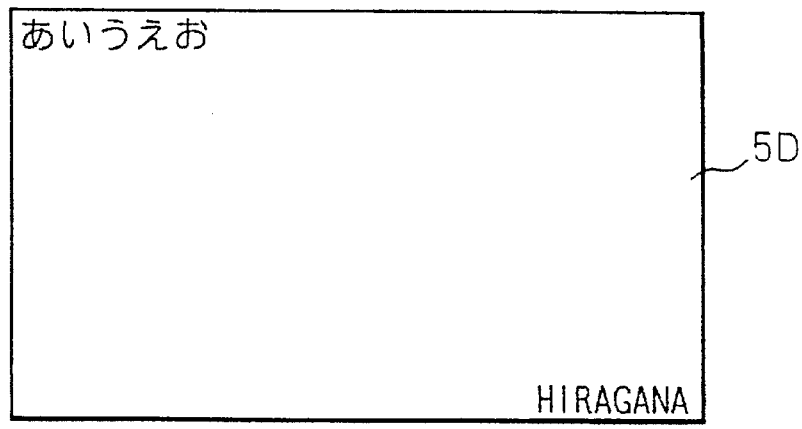
FIG. 16A is an explanatory view showing a display screen in a display device when the data processor shown in FIG. 2 is in the hiragana input condition.
Figure 16B:
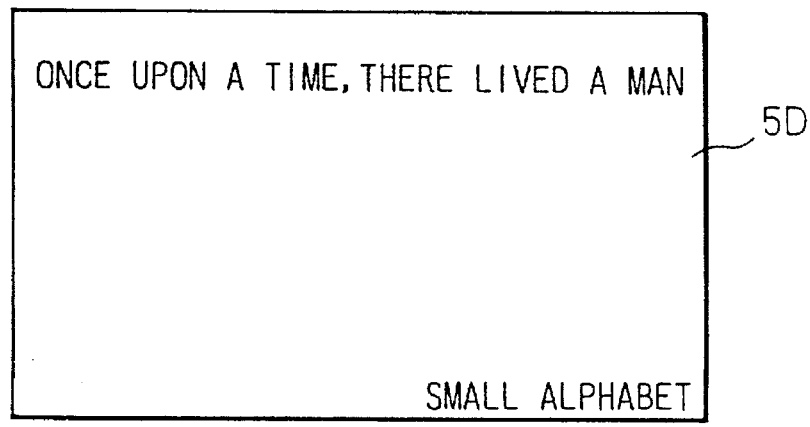
FIG. 16B is an explanatory view showing a display screen in the display device when the data processor shown in FIG. 2 is in the small letter of alphabet input condition.
Figure 16C:
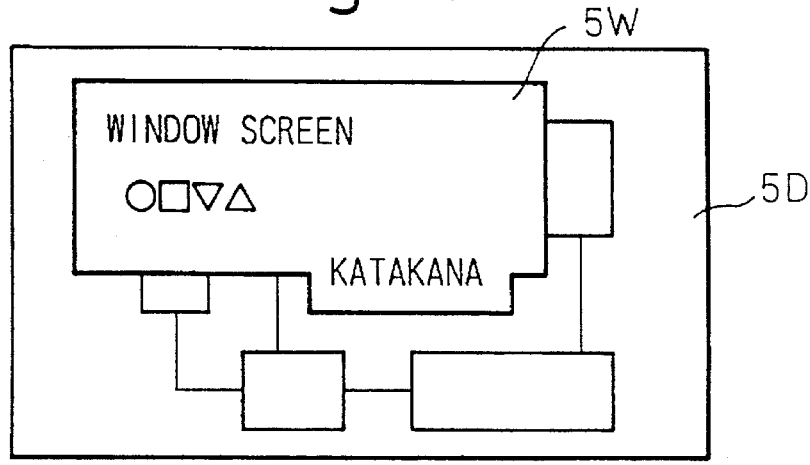
FIG. 16C is an explanatory view showing the display screen of the display device when the data processor shown in FIG. 2 is in the katakana input condition.

More concretely, this input mode detection portion 26 decodes code information written into a stipulated region of the screen code buffer 21 or the change command of that code information, and so detects the character input mode used by the application program 20. When the display device 5 is in the hiragana mode, for example, as shown in FIG. 16(A), the mark hiragana is displayed at the lower right portion of the screen 5D of the display device 5 to represent that the display mode is the "hiragana" mode. When the display device 5 is under the small-letter-alphabet mode as shown in FIG. 16(B), the mark "small-letter-alphabet" is displayed at the lower right portion of the screen 5D. When the display device 5 has a window function, the character input mode at each time, such as "katakana" at the time of the "katakana" mode, is displayed at the lower right portion of the window screen 5W as shown in FIG. 16C.

In other words, since the application program 20 employs the construction wherein the character input mode is displayed on the display device 5 by writing the code information of the character input mode into a predetermined region of the screen code buffer 21, the input mode detecting portion 26 detects the character input mode used by the application program 20 by decoding the code information of the character input mode written into the screen code buffer 21 or the change command of the code information.

Here, this detection processing can be executed by directly decoding the code information of the screen code buffer 21 (represented by solid line in FIG. 2), or by decoding the change command of the code information outputted from the kana-kanji conversion portion 22 to the screen code buffer 21 (represented by dotted line in FIG. 2). When the code information of the screen code buffer 21 is directly decoded, this decoding may be carried out whenever the key on the keyboard is touched and the key address is generated. When the change command of the code information outputted from the kana-kanji conversion portion 22 to the screen code buffer 21 is decoded, the decoding operation can be carried out whenever the change command is generated.

An embodiment of the first invention for accomplishing the key-code outputting apparatus 10 of the present invention will be first explained.

As has already been explained with reference to FIGS. 1C and 1D, this first invention is applied to the case where the data is inputted to the data processor 1 by using a keyboard equipped with the keys each having two or more kinds of characters assigned thereto. This invention accomplishes a construction for providing a correct key-code even when the key arrangement assumed by the application program 20 as the data processing program (for example, the JIS key arrangement shown in FIG. 1C) is different from the key arrangement of the keyboard 4S connected to the data processor 1 (for example, the thumb shift key arrangement shown in FIG. 1D).

Figure 1A:
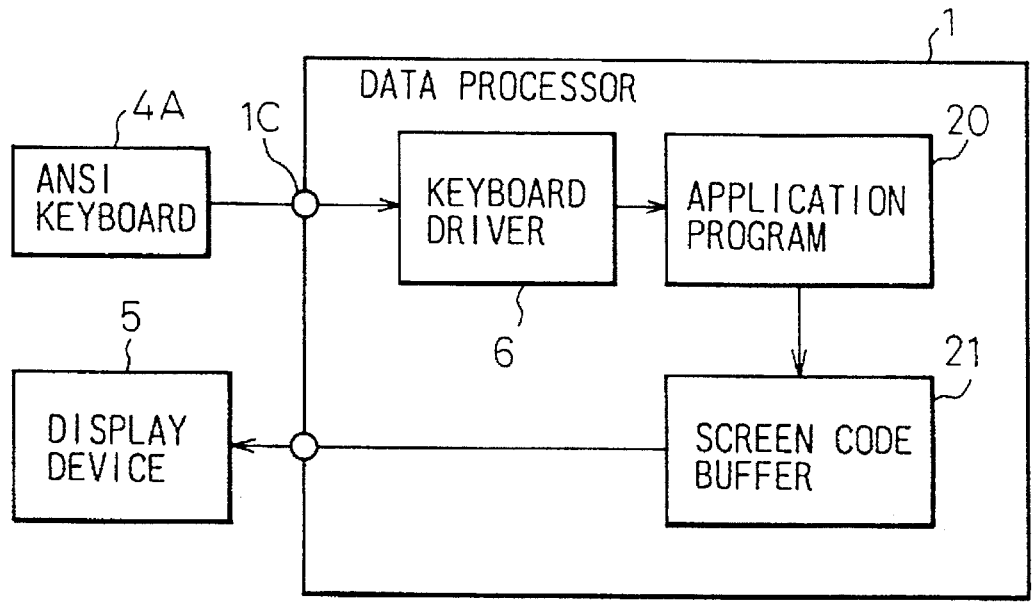
FIG. 1A is a block circuit diagram showing the construction of a data processor equipped with a keyboard according to the prior art.
Figure 1B:
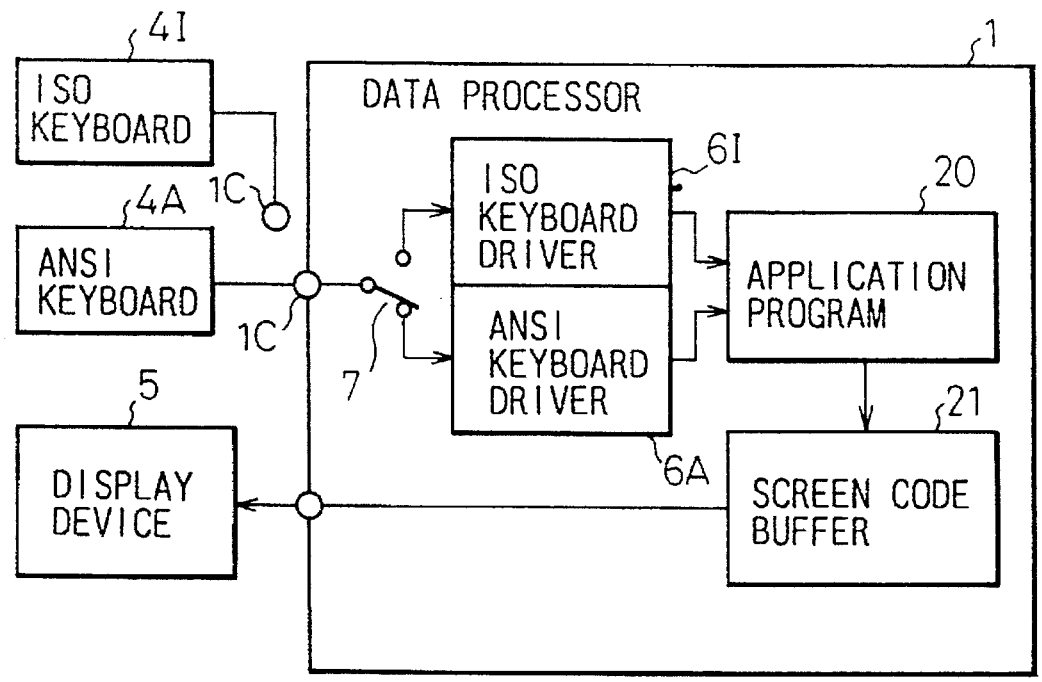
FIG. 1B is a block circuit diagram showing the construction of a data processor equipped with a keyboard interchanging function.

For example, in the case of the JIS arrangement keyboard, when the key 8J having "A" and the character shown by the alphabet T assainged thereto is touched as shown in FIG. 1C, a key-code "41" is generated irrespective of the kana input mode/alphabet input mode, and receiving this kay code "41", the application program 20 assuming the key arrangement of the JIS arrangement keyboard recognizes the key-code as the character shown by the alphabet T when using the kana input mode and as "A" when using the alphabet input mode. In the case of the thumb shift arrangement keyboard 8S shown in FIG. 1D, on the other hand, a kana the character shown by the alphabet U is assigned to the key of the alphabet "A". (Here, the kana the character shown by the alphabet W, which is inputted by the simultaneous touching operation with the afore-mentioned thumb shift key is not referred to.) Accordingly, when the thumb shift arrangement keyboard 8S is connected to the application program 20 assuming the key arrangement of the JIS arrangement keyboard 8J, the application program 20 receives the erroneous key-code. By the way, the JIS arrangement keyboard 8J employs the construction wherein a key-code "34" is generated when the key the character shown by the alphabet T is touched. To solve this problem which occurs when the thumb shift arrangement keyboard 4S is connected during the execution of the application program 20 assuming the key arrangement of the JIS arrangement keyboard 4J, the correspondence relation between the A/the character shown by the alphabet U key (with the kana the character shown by the alphabet W beign omitted) and the key-code "41" is registered in the alphabet conversion table 24 (JIS conversion table) in this first invention while the correspondence between the A/the character shown by the alphabet U key and the key-code "34" is registered in the kana conversion table (thumb shift conversion table) 23S as shown in FIG. 3.

The data processor 1 can discriminate whether the keyboard 4S has the JIS key arrangement or the thumb shift key arrangement, by detecting the wiring to the terminals of the connector 1C. An example of such a construction will be explained with reference to FIGS. 14A to 14C.

Figure 13:
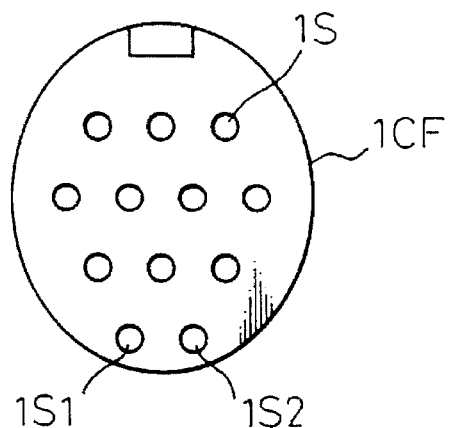
FIG. 13 is a front view showing the shape of a connector for connecting the keyboard of the data processor according to the present invention.

FIG. 13 is a front view showing the shape of a female connector 1CF for connecting the keyboard to the data processor 1 shown in FIG. 2. A socket 1S capable of accepting 12 pins, for example, is provided to the female connector 1CF of the data processor 1. Among the twelve sockets 12S, two sockets 1S1, 1S2 at the lower end portion are the sockets for detecting the keyboard.

Figure 14A:
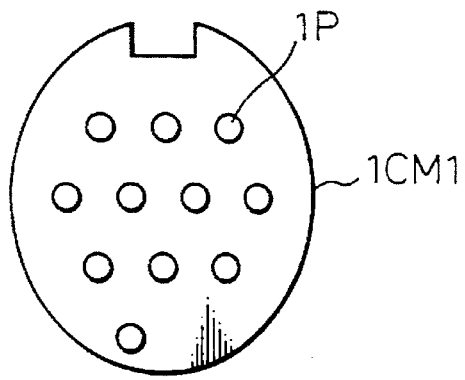
FIGS. 14A to 14C are front view showing the shapes of connectors on the side of three kinds of keyboards having mutually different key arrangements, to be connected to keyboard connected of the data processor shown in FIG. 13.
Figure 14B:
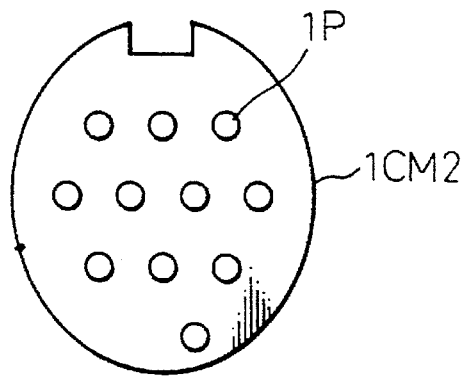
Figure 14C:
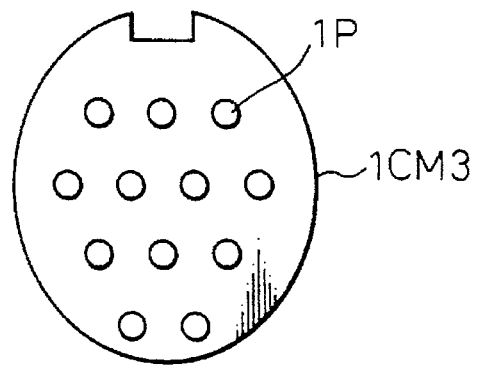

In contrast, FIGS. 14A to C are front views showing the shapes of the connectors 1CM1 to 1CM3 on the side of three kinds of keyboards having mutually different key arrangements, respectively. In the first kind of the keyboard, eleven pins 1P are implanted to its connector 1CM1, and the number of the pins 1P is smaller by one than the number of the twelve sockets 1S disposed in the connector 1CF on the data processor 1 side. In this embodiment, a pin to be inserted into the socket 1S1 disposed on the connector 1CF on the data processor side does not exist in the first kind of the keyboard. Accordingly, when the first kind of the keyboard is connected to the connector 1CF on the data processor side 1, the pin is not inserted into the socket 1S1, so that the first kind of the keyboard can be detected on the data processor 1 side.

Similarly, eleven pins 1P are disposed in the connector 1CM2 of the second kind of the keyboard, and a pin does not exist at the position of the socket 1S2 of the connector 1CF on the data processor 1 side. The same number of pins 1P, that is, twelve pins 1P, as the number of the twelve socket 1S disposed on the connector 1CF on the data processor 1 side are disposed on the connector 1CM2 of the third kind of the keyboard. Accordingly, when the second kind of the keyboard 1CM2 is connected to the connector 1CF on the data processor 1 side, a pin is not inserted into the socket 1S2, so that the second kind of the keyboard can be detected on the data processor 1 side. When the third kind of the keyboard 1CM3 is connected to the connector 1CF on the data processor 1 side, the pins are inserted into both the sockets 1S1 and 1S2, so that the third kind of the keyboard can be detected on the data processor 1 side.

Figure 15:
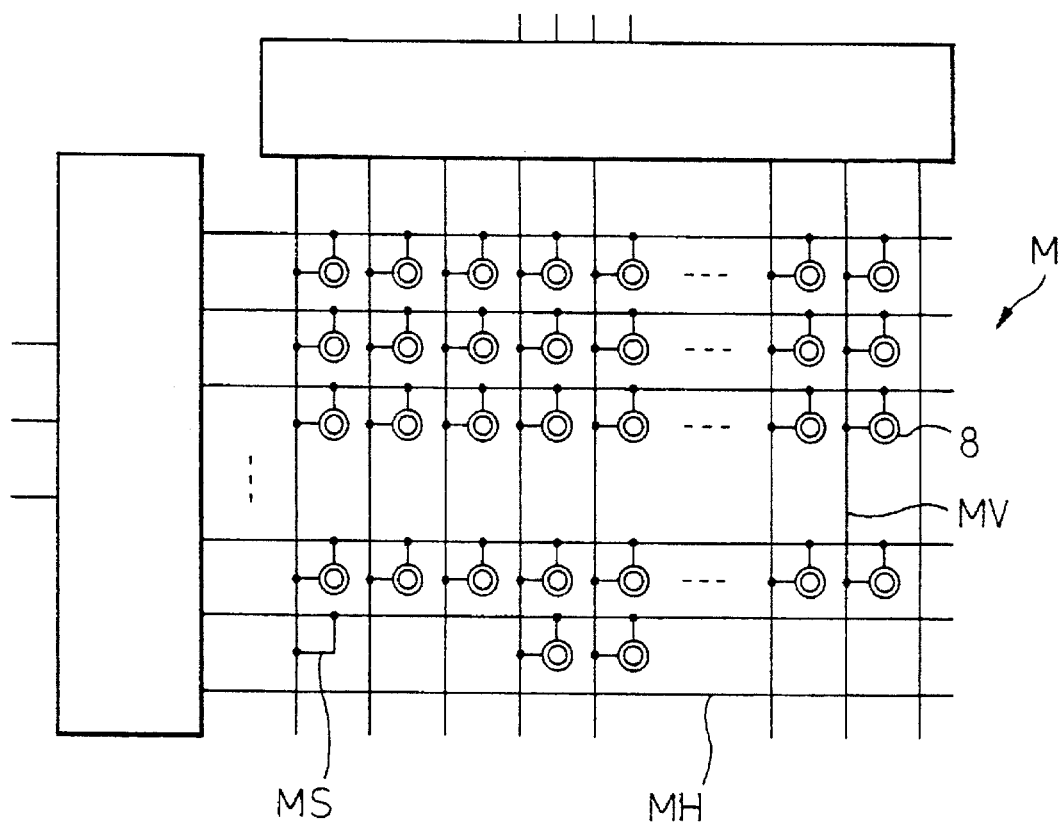
FIG. 15 is a matrix circuit diagram useful for explaining an example of discrimination of the kind of keyboards, by using a matrix circuit inside the keyboard.

Next, another example of judgement of the kind of the keyboard will be explained with reference to FIG. 15. FIG. 15 is a circuit diagram useful for explaining the example of the judgement of the kind of the keyboard using a matrix circuit M inside the keyboard M. A plurality of circuits MH are disposed in the horizontal direction in the matrix circuit M, and a plurality of circuits MV are also disposed in the vertical direction. Keys 8 are disposed at the points of intersection between the circuits MH in the horizontal direction and the circuits MV in the vertical direction. When a given key 8 is touched, the circuit MH in the horizontal direction and the circuit MV in the vertical direction are short-circuited at that position, and this short-circuit signal makes it possible to judge which key is touched. When the kind of the keyboard is judged by using such a matrix circuit M, a short-circuit MS is formed in advance at a specific position at which the key is not disposed. Then, when the keyboard is connected to the data processor, the predetermined position on the matrix circuit M not having the key is always in the short-circuit state, so that the kind of the keyboard can be detected by detecting this short-circuit position MS from the output signal obtained after the scanning of the matrix circuit M.

Further, as an another example, it is possible to detect the kind of keyboard connecting to the data processor by setting the display apparatus 5 to display a message which instruct an operator to input the kind of keyboard from the keyboard.

When the construction capable of detecting the kind of the keyboard is employed as described above and moreover, when the input mode detecting portion 26 detects that the operation mode is the kana input mode, the switching portion 25 selects the kana conversion table 23, and the code generating portion 27 generates the key-code "34" when the "A/the character shown by the alphabet U" key on the keyboard 4 is touched, as shown in FIG. 4A. As a result, the application program 20 recognizes from this key-code "34" that the character shown by the alphabet U is inputted. On the other hand, when the input mode detecting portion 26 detects that the operation mode is the alphabet input mode, the switching portion 25 selects the alphabet conversion table 24. At this time, the code generating portion 27 generates the key-code "41" when the "A/the character shown by the alphabet U" key on the keyboard 4 is touched, as shown in FIG. 4B. As a result, the application program 20 recognizes from the key-code "41" that "A" is inputted.

In the first invention for accomplishing the key-code outputting apparatus 10 of the invention described above, the keyboard having the keys each having two or more kinds of characters assigned thereto is connected to the data processor 1, and even when the key arrangement assumed by the application program 20 is different from the key arrangement of the keyboard 4, the application program 20 receives the correct key-code and can recognize the characters of the key.

Figure 17:
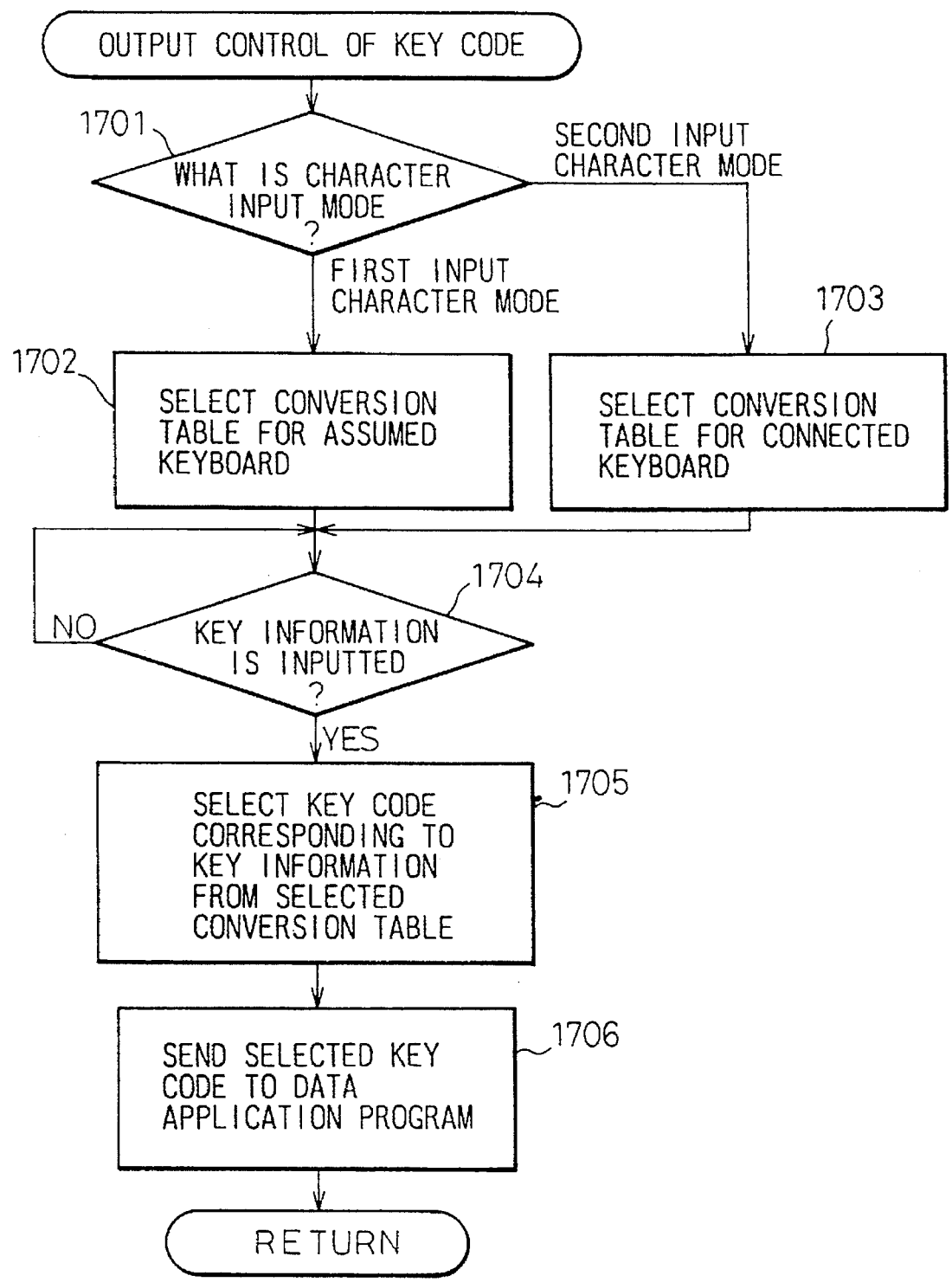
FIG. 17 is a flowchart useful for explaining the procedure of generation control of the key-code in the first embodiment of the present invention.

FIG. 17 is a flowchart useful for explaining the generation control of the key-code in the first invention explained above.

At first step 1701, the present character input mode is detected by the input mode detecting portion 26. If the detected character input mode is the first character input mode, the control proceeds to step 1702, and a conversion table for the assumed keyboard by the application program 20 is selected by the switching portion 25 at step 1702. If the detected character input mode is the second character input mode, the control proceeds to step 1703, and a conversion table for the connected keyboard to the data processor 1 is selected by the switching portion 25 at step 1703. The kind of connected keyboard to the data processor 1 has already recognized by the data processor 1 by using one of the aforementioned method.

Note that when the keyboard assumed by the application program 20 is JIS arrangement keyboard and the keyboard actually connected to the data processor 1 is the thumb shift arrangement keyboard, the first character input mode corresponds to the alphabet input mode and the second character input mode corresponds to hiragana input mode, the conversion table for assumed keyboard corresponds to the alphabet conversion table 24, and the conversion table for actually connected thumb shift arrangement keyboard corresponds to the kana conversion table 24S.

After the certain conversion table is selected at steps 1702 or 1703, it is determined whether or not the key information is inputted from the keyboard by the code generating portion 27. If the key information is inputted, the control proceeds to step 1705.

At step 1705, a key-code is selected by the code generating portion 27 in accordance with the inputted key information by using the selected conversion table by the switching portion 25. Then at step 1706, the selected key-code is sent to the application program 20.

In this way, the key-code corresponding to the kind of keyboard is outputted in accordance with the present character input mode, after the selection of the conversion table for assumed keyboard by the application program 20 or the selection of the conversion table for the actually connected keyboard.

Next, an embodiment of the second invention for accomplishing the key-code outputting apparatus 10 of the present invention will be explained.

In the second invention, the character or symbol to be inputted by a certain key is inputted in combination with the shift key in the keyboard having the key arrangement assumed by the application program 20, but when a keyboard having the key arrangement different from the one assumed by the application program 20 is connected to the data processor, the second invention accomplishes the construction wherein the application program 20 can receive the correct key-code for the character or the symbol even when the character or the symbol is inputted without the shift key.

In the keyboard of the ANSI arrangement, for example, the semicolon ";" and the colon ":" are assigned to the same key. The semicolon ";" is inputted by touching the key as such, while the colon ":" is inputted by touching the key while the shift key is depressed. In the keyboard of the ISO arrangement, on the other hand, the semicolon ";" and the colon ":" are assigned to separate keys, and they can be inputted when the respective keys are touched. Accordingly, when the keyboard of the ISO arrangement is connected to the data processor 1 having the application program 20 assuming the keyboard of the ANSI arrangement, the application program 20 receives the wrong key-code.

The second invention eliminates such a problem that occurs when a keyboard of the ISO arrangement is connected to the data processor having the application program 20 assuming a keyboard of the ANSI arrangement. To this end, the second invention manages the management data of the ANSI conversion table 23A by dividing it to an unshift mode and a shift mode as shown in FIG. 5A. For example, an unshift mode management zone and a shift mode management zone are prepared inside the ANSI conversion table 23A for the keyboard of the ANSI arrangement. As to the ";/:" key, for example, the key-code "3B" of this key ";/:" is stored as the output code in the unshift mode management zone and the key-code "0E" of the shift key is stored in the shift mode management zone together with the key-code "3B" of the key ";/:" as the output code.

As to the keyboard of the ISO arrangement, on the other hand, the same key-code as the key-code "3B" stored in the unshift mode management zone for the ";/:" key of the ANSI arrangement is stored as the output code in the ISO conversion table 23, and the combination of the key-codes "0E" and "3B" stored in the shift mode management zone for the ";/:" key of the keyboard of the ANSI arrangement is stored as the output code in the ISO conversion table 23.

Here, whether the keyboard is the keyboard of the ANSI arrangement or the keyboard of the ISO arrangement can be recognized by the data processor by changing the pin arrangement of the connector or by changing the short-circuit position inside the matrix circuit as described already.

Figure 6A:
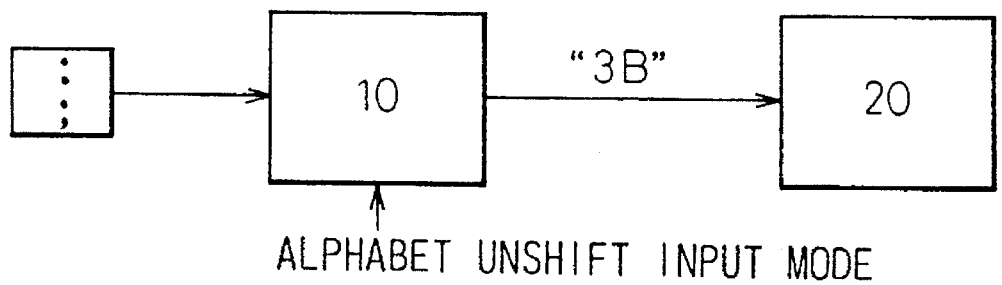
FIG. 6A is a block diagram useful for explaining the processing of the key-code outputting apparatus in the alphabet unshift input mode of an ANSI keyboard in the second embodiment of the present invention.
Figure 6B:
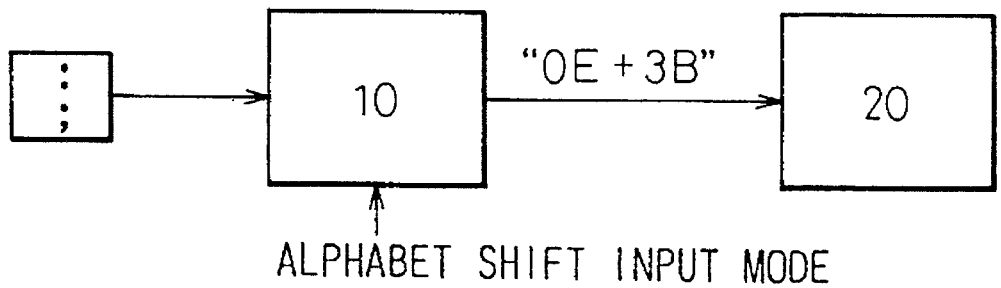
FIG. 6B is a block diagram useful for explaining the processing of the key-code outputting apparatus in the alphabet shift input mode of the ANDSI keyboard in the second embodiment of the present invention.

In the second convention having the construction described above, when the keyboard of the ANSI arrangement is connected to the data processor 1 and when the input mode detecting portion 26 detects that the character input mode is the unshift input mode of the alphabet, the switching portion 25 selects the unshift mode management zone of the ANSI conversion table 23A. Receiving this selection, the code generating portion 27 generates the key-code "3B" when the key ";/:" of the keyboard is touched, and notifies to the application program 20 that ";" is inputted. On the other hand, when the input mode detecting portion 26 detects that the character input mode is the alphabet shift input mode, the switching portion 25 selects the shift mode management zone of the ANSI conversion table 23A, and receiving this selection, the code generating portion 27 generates the key-code "0E+3B" when the key ";/:" of the keyboard is touched, and notifies to the application program 20 that ";" is inputted. FIGS. 6A and 6B show this conversion processing.

FIG. 6A shows the state where the keyboard of the ANSI arrangement is connected to the data processor 1 and the key-code outputting apparatus 10 sends the key-code "3B" to the application program 20 when the key ";/:" of the keyboard is touched in the alphabet unshift input mode. FIG. 6B shows the state where the keyboard of the ANSI arrangement is connected to the data processor 1 and the key-code outputting apparatus sends the key-code "0E+3B" to the application program 20 when the key ";/:" of the keyboard is touched in the alphabet shift input mode.

Figure 6C:
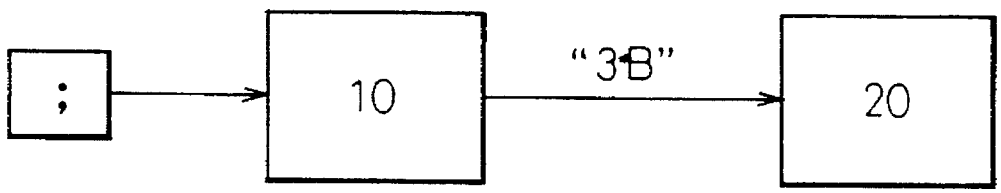
FIG. 6C is a block diagram useful for explaining the processing of the key-code outputting apparatus when a semicolon key of an ISO keyboard is turned on in the second embodiment of the present invention.
Figure 6D:
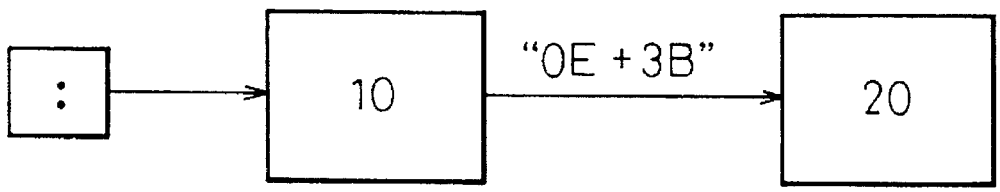
FIG. 6D is a block diagram useful for explaining the processing of the key-code outputting apparatus when a colon key of the ISO keyboard is turned on in the second embodiment of the present invention.

In the second invention, when the keyboard of the ISO arrangement is connected to the data processor 1, the switching portion 25 selects the ISO conversion table 23I. Receiving this selection, the code generating portion 27 reads out the key-code "3B" from the ISO conversion table 23I when the ";" key of the keyboard is touched, and notifies to the application program 20 that ";" is inputted. On the other hand, when the ";" key of the keyboard is touched, the code generating portion 27 reads out the key-code "0E+3B" from the ISO conversion table 23I, and notifies the application program 20 that ";" is inputted. FIGS. 6C and 6D show this conversion processing.

FIG. 6C shows the state where the keyboard of the ISO arrangement is connected to the data processor 1 and the key-code outputting apparatus 10 sends the key-code "3B" to the application program 20 when the ";" key of the keyboard is touched in the alphabet unshift mode. FIG. 6D shows the state where the keyboard of the ISO arrangement is connected to the data processor 1 and the key-code outputting apparatus 10 sends the key-code "0E+3B" to the application program 20 when the ";" key of the keyboard is touched in the alphabet shift mode.

Even when the keyboard having the key arrangement not using the shift key is connected to the data processor in the case where the key arrangement assumed by the application program 20 uses the combination with the shift key as in the case of the keyboard of the ANSI arrangement, the key-code outputting apparatus 10 of the second invention makes it possible for the application program 20 to receive the correct key-code.

Next, an embodiment of the third invention for accomplishing the key-code outputting apparatus 10 of the present invention will be explained.

This third invention accomplishes the construction wherein the application program 20 can receive the correct key-code even when the key arrangement assumed by the application program 20 is different from the key arrangement of the keyboard connected to the data processor and moreover, when a specific kind of character can be inputted in only a certain character input mode in the key arrangement assumed by the application program 20 but the same kind of character can be inputted in a plurality of character input modes in a keyboard having a different key arrangement.

In the JIS arrangement keyboard having no ten-keys which is an independent keyboard for inputting numerical figures, for example, the numerical figures as the specific kind of characters can be inputted in only the alphabet input mode. In the thumb shift arrangement keyboard, on the other hand, the numerical figures can be inputted in the alphabet input mode and in the kana input mode. The reason for this is that the key for inputting a numerical figures in an alphabet input mode are also used for inputting one of hiragana character in a hiragana input mode in the aforementioned JIS arrangement keyboard. That is, one of the numerical figures and one of hiragana character are assigned on the same key in the aforementioned JIS arrangement keyboard. Contrary to this, in the thumb shift arrangement keyboard, numerical figures are assigned on the independent keys which are not used for inputting hiragana. In such a case, in the data processor equipped with the application program 20 assuming the key arrangement of the JIS arrangement keyboard, the application program 20 receives the wrong key-code at the time of the input of the numerical figures in the kana input mode when the thumb shift arrangement keyboard is connected to the data processor.

To eliminate such a disadvantage, the third invention solves the problem in the following way when the thumb shift arrangement keyboard is connected to the data processor equipped with the application program 20 assuming the JIS arrangement keyboard. To simplify the explanation, the specific kind of characters is hereby assumed as the numeric keys, and the construction of the third invention will be explained with reference to FIG. 7.

In the third invention, at least the thumb shift conversion table 23S and the JIS conversion table 24 are connected to the switching portion 25 shown in FIG. 2. The explanation will be given hereby on the case where the numeric key is the "1" key. By the way, it will be assumed that in the JIS arrangement keyboard, the alphabet function key is touched to switch the mode to the alphabet input mode, and the kana function key is touched to switch the mode from the alphabet input mode to the kana input mode. It will be assumed further that the key-codes are as follows when the alphabet function key is touched and when the kana function key is touched, respectively:

"12": key-code when alphabet function key is touched;

"11": key-code when kana function key is touched.

In the third invention, the key-code "12" when the alphabet function key for switching the mode to the alphabet input mode in the JIS arrangement keyboard is touched, the key-code "31" when the numeric key "1" is touched, and the key-code "11" when the kana function key for switching the mode to the kana input mode in the JIS arrangement keyboard is touched are stored in the memory area of the numerical figures of the thumb shift conversion table 23S. Similarly, as to other numerical figures, the key-code when the alphabet function key for switching the mode to the alphabet input mode in the JIS arrangement keyboard is touched and the key-code when the kana function key for switching the mode to the kana input mode in the JIS arrangement keyboard are stored in combination before and after of the key-code when each key is touched.

Here, the data processor can recognize whether the keyboard is the JIS arrangement keyboard or the thumb shift arrangement keyboard, by changing the aforementioned pin arrangement of the connector or by changing the short-circuit position inside the matrix circuit.

While the thumb shift arrangement keyboard is connected to the data processor having the application program assuming the JIS arrangement keyboard in the third invention having the construction described above, when the "1" key on the thumb shift arrangement keyboard 4S is touched in the kana input mode, the code generating portion 27 generates the key-code "12+31+11" in accordance with the management data of the thumb shift conversion table 23S. As a result, the same key-code as the one, that is inputted when the "1" key is touched in the alphabet input mode in the JIS arrangement keyboard, is inputted to the application program 20 and then the key-code for returning the mode to the original kana input mode is inputted.

In the third invention, the application program 20 can receive the correct key-code even when the key arrangement assumed by the application program 20 is different from the key arrangement of the keyboard connected to the data processor and even when the specific kind of characters can be inputted in only a certain character input mode in the key arrangement assumed by the application program 20 but the same kind of characters can be inputted in a plurality of character input modes in the keyboard having the different key arrangement.

Next, an embodiment of the fourth invention for accomplishing the key-code outputting apparatus 10 of the present invention will be explained.

When accomplishing the third invention described above, this fourth invention accomplishes a repeat (typematic) function which continuously outputs the same key-code when the numeric key is continuously touched.

To accomplish the repeat function, this fourth invention employs the construction which manages the management data of the thumb shift conversion table 23S in the third invention by dividing it into an ON mode, an OFF mode and a continuous mode. In the fourth invention, the key-codes when the alphabet function key is released, when the kana function key is released and when the "1" key is released are added in the following way in addition to the key-code "12" when the alphabet function key for switching the mode to the alphabet input mode is touched, the key-code "11" when the kana function key for switching the mode to the kana input mode and the key-code "31" when the "1" key is touched:

"92": key-code when alphabet function key is released;
"91": key-code when kana function key is released;
"B1": key-code when "1" key is released.

Under this state, the fourth invention will be explained about the case of the numeric "1" key by way of example. In the fourth invention, the key-code "12" when the alphabet function key is touched, the key-code "92" when the alphabet function key is released and the key-code "31" when the numeric key "1" is released are stored for the "1" key in the ON mode management region of the thumb shift conversion table 23S as shown in FIG. 8. The key-code "B1" when the numeric key "1" is released, the key-code "11" when the kana function key is touched and the key-code "91" when the kana function key is released are stored in the OFF mode management region.

As to other numerical figures, too, the key-code at the time of the ON mode of each key is stored in combination with the key-codes when the alphabet function key is turned ON and OFF, and the key-code of that key at the time of the OFF mode is stored in combination with the key-codes when the kana function key is turned ON and OFF.

When the thumb shift arrangement keyboard is connected to the data processor having the application program assuming the JIS arrangement keyboard and the character input mode of the data processor is the kana input mode in the fourth invention having the construction described above, when the numeric key "1" on the thumb shift arrangement keyboard 4S is touched, the code generating portion 27 generates the key-code "12+92+31" in accordance with the management data of the thumb shift conversion table 23S. As a result, the alphabet function key is turned ON/OFF and the mode changes to the alphabet input mode in the JIS arrangement keyboard, and under this state, the same key-code as the key-code, which is inputted when the numeric key "1" is touched, is inputted to the application program 20.

When the numeric key "1" is continuously touched in the alphabet input mode, the code generating portion 27 continuously generates the key-code "31" in accordance with the management data of the thumb shift conversion table 23S. When the numerical key "1" is released, the code generating portion 27 generates the key-code "B1+11+91" in accordance with the management data of the thumb shift conversion table 23S. As a result, the report is made to the application program 20 to the effect that the kana function key is turned ON/OFF after the "1" key is released in the JIS arrangement keyboard, and the mode changes to the kana input mode.

Figure 18:
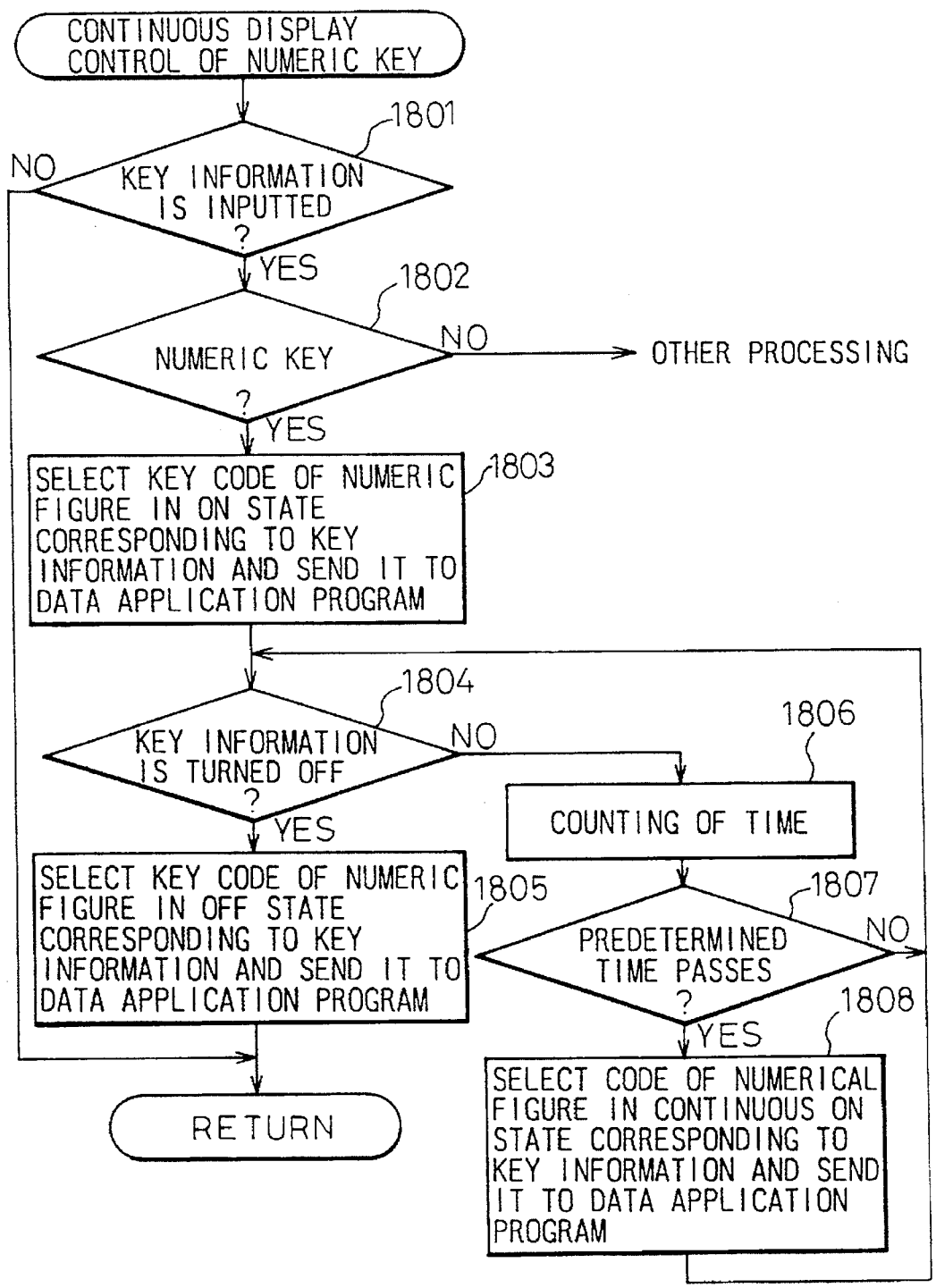
FIG. 18 is a flowchart useful for explaining the procedure of controlling a continuous display when numeral character keys are pushed for a long time in the fourth embodiment of the present invention.

FIG. 18 is a flowchart useful for explaining the procedure of the continuous display control of the numerical keys in the fourth invention described above.

At step 1801, whether or not the key information is inputted is judged. When the key information is inputted, the control proceeds to step 1802. Whether or not the key is a numeric key is judged at step 1802, and other processing is executed when it is not the numeric key. When it is, the control proceeds to stp 1803. At step 1803, the code under the ON state is selected in accordance with the inputted key information, and is sent to the application program.

At subsequent step 1804, whether or not the key information is turned OFF is judged, and when the key information is turned OFF, the control proceeds to step 1805 and the code of the numerical figure under the OFF state is selected in accordance with the key information and is sent to the application program. When the key information is not turned OFF, on the other hand, the control proceeds to step 1806 and the time is counted. At subsequent step 1807, whether or not a predetermined time passes is judged, and when the predetermined time does not pass, the control returns to the step 1804, and the time is further counted at step 1806. If the key information is turned OFF at the point of time when the control returns to step 1804, the control proceeds to step 1805.

When the predetermined time is judged as passed, the control proceeds to step 1808, and the key-code of the numerical figure under the continuous ON state corresponding to the key information is selected and is sent to the application program. When step 1808 is completed, the control again returns to step 1804. Therefore, if the numerical key is kept touched, step 1808 is periodically executed and the key-code of the numerical key is interruptedly inputted to the application program 20 at predetermined time intervals.

In the fourth invention described above, even when the key arrangement assumed by the application program 20 is different from the key arrangement of the keyboard connected to the data processor and when specific kinds of characters can be inputted only in a certain character input modes in the key arrangement assumed by the application program 20 but the same kinds of characters can be inputted in a plurality of character input modes in the keyboard having the different key arrangement, the application program 20 can receive the correct key-code. Further, in the fourth invention, the user can apply the key-code of the same kind of characters by continuously touching the key.

By the way, in the embodiment of this fourth embodiment, entry to the alphabet input mode can be indicated to the application program 20 by using the combination of the key-code "12" when the alphabet function key is ON and the key-code "92" when it is turned OFF. Entry to the kana input mode can be indicated to the application program 20 by using the combination of the key-code "11" when the kana function key is ON and the key-code "91" when it is OFF. On the other hand, as represented by the embodiment of the foregoing third invention, entry to the alphabet input mode is indicated to the application program 20 by using only the key-code "12" of ON of the alphabet function key, and entry to the kana input mode can be indicated to the application program 20 by using only the key-code "11" of ON of the kana function key.

Next, an embodiment of the fifth invention will be explained.

The data processor as the object of the fifth invention is the data processor of the type wherein the keyboard 4 has keys each having two or more kinds of characters assigned thereto, the different kinds of characters of the same key are inputted in mutually different character input modes, and the character input modes change in accordance with ON/OFF of the function key. In such a data processor, when the JIS arrangement keyboard is connected, for example, if it becomes necessary for the operator (user) to input other kind of characters such as a numerical figure during the input operation of the hiragana, for example, the numeric key which is desired to be inputted is turned ON and OFF by turning ON and OFF the alphabet function key, and then the character input mode must be returned to the hiragana mode by turning ON and OFF the kana function key.

The reason for this is that not only a numerical figure but also a hiragana are assigned on the key for inputting a numerical figure in an alphabet input mode on the aforementioned JIS arrangement keyboard in order to be used as a key for inputting a hiragana in a hiragana input mode.

In the case of the thumb shift arrangement keyboard, the numerical figure can be inputted in the same character input mode during the input operation of the hiragana, but the alphabet cannot be inputted.

While the JIS arrangement keyboard is connected to the data processor, the fifth invention simplifies such a complicated operation necessary for inputting the numerical figure during the input operation of the hiragana and makes it possible to input other kind of characters inputted in other character input mode and assigned to the same key, without requiring the user to change the character input mode. Further, the fifth invention enables the application program 20 of the data processor to correctly receive the key-code of this kind of character. While the thumb shift arrangement keyboard is connected to the data processor, on the other hand, the fifth invention simplifies such a complicated procedure required when inputting the alphabet during the input operation of the hiragana, makes it possible to input other kind of characters inputted in other character input mode by a simple operation without requiring the user to change the character input mode, and enables the application program 20 of the data processor to correctly receive the key-code of this other kind of character.

For example, when a keyboard (thumb shift arrangement keyboard) 4 wherein the kana the character shown by the alphabet N in FIG. 11A (which is inputted in the kana input mode and the semicolon ";" (which is inputted in the alphabet input mode) are assigned to the same key is connected to the data processor, the user can input the semicolon ";" from the keyboard 4 during the input operation of the kana from the keyboard 4 in the kana input mode, and the key-code of the semicolon ";" can be correctly transmitted to the application program 20.

Figure 9:
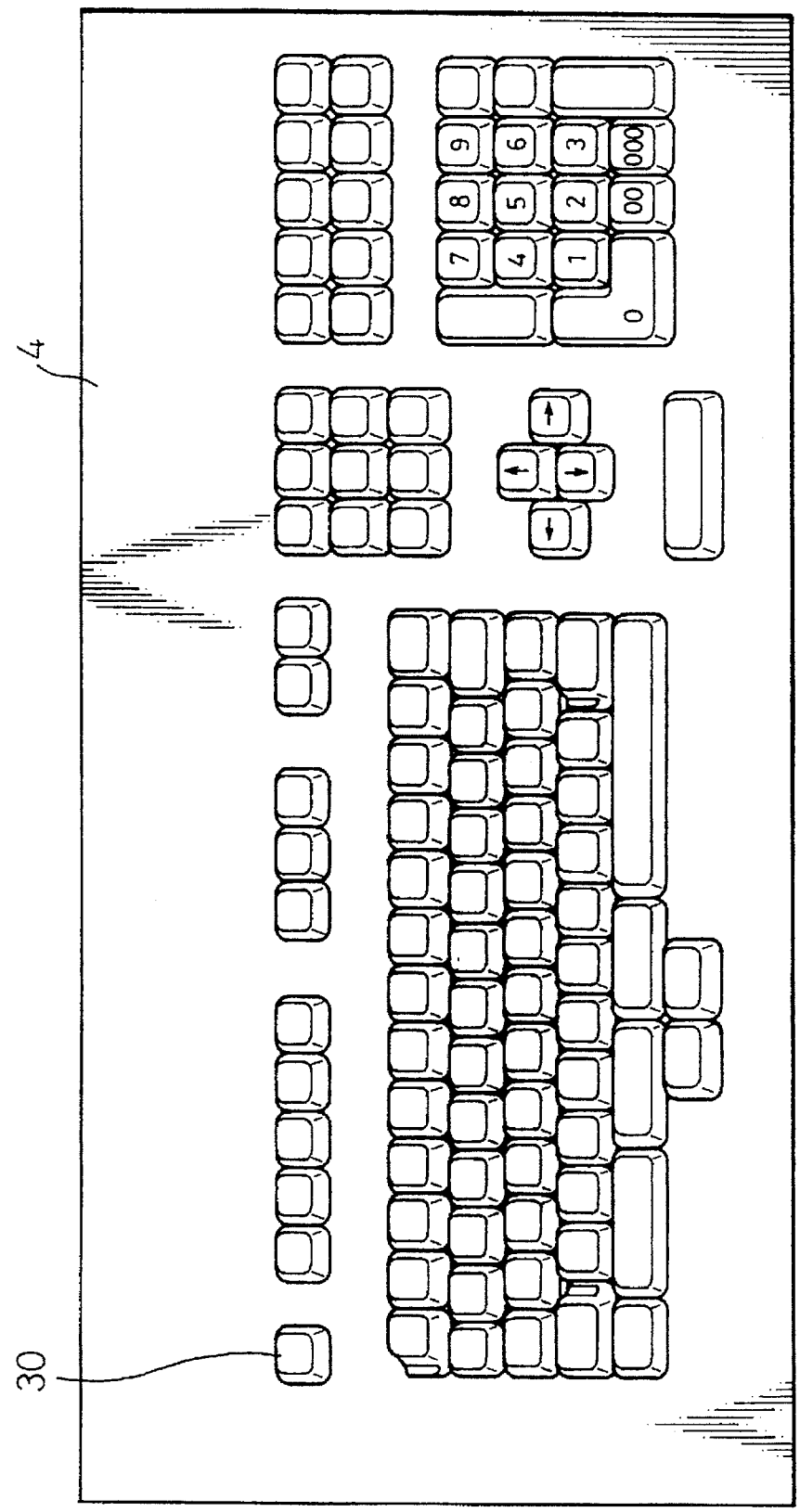
FIG. 9 is a plan view of the keyboard showing the key construction according to the fifth embodiment of the present invention.

To this end, an alphabet shift key 30 is disposed afresh on the keyboard in this fifth invention as shown in FIG. 9. Further, as shown in FIGS. 10(A) and (B), the JIS conversion table (alphabet conversion table) 24 and the thumb shift conversion table (kana conversion table) 23S store the code "12, 92" as the key-code which is generated when this alphabet shift key 30 is turned ON and the code "11, 91" as the key-code generated when this alphabet shift key 30 is turned OFF. As described before, "12" is the key-code when the alphabet function key is turned ON, "92" is the key-code generated when the alphabet function key is turned OFF, "11" is the key-code generated when the kana function key is turned ON and "92" is the key-code generated when the kana function key is turned OFF.

In this instance, the data processor can recognize whether or not the kinds of characters to be inputted in the different kinds of character input modes are assigned to the same key, for example, whether the keyboard is the keyboard of the JIS arrangement or the keyboard of the thumb shift arrangement, by changing the pin arrangement of the connectors or by changing the short-circuit position inside the matrix circuit as already described.

In the fifth invention, when the character input mode is the kana input mode and when the alphabet key 30 of the keyboard is touched in this case, the code generating portion 27 generates the key-code "12+92" in accordance with the management data of the kana conversion table 23. The application program 20 recognizes the shift of the input mode to the alphabet input mode from this key-code "12+92". Therefore, when "the the character shown by the alphabet N in FIG. 11B/;" key is thereafter touched while the alphabet shift key 30 is kept touched and its key-code is transmitted to the application program 20, the application program 20 recognizes that the "the character shown by the alphabet N in FIG. 11B/;" key is touched in the alphabet input mode and that the character ";" is inputted. This state is shown in FIG. 11A.

When the alphabet shift key 30 is thereafter released, the key-code generating portion 27 generates the key-code "11+91" in accordance with the management date of the kana conversion table 23. The application program 20 recognizes the shift of the input mode to the kana input mode from this key-code "11+91". Accordingly, when the alphabet key 30 is thereafter turned OFF, the "in FIG. 11A/;" key is touched and its application code is transmitted to the application program 20, the application program 20 recognizes that the "the character shown by the alphabet N in FIG. 11B/;" key is touched in the kana input mode and that the character "the character shown by the alphabet N in FIG. 11B" is inputted. This state is shown in FIG. 11B.

As described above, in the data processor of the type wherein two or more kinds of characters are assigned to each key of the keyboard 4, the different kinds of characters of the same key are inputted in the different kinds of character input modes and the character input modes of the data processor change in accordance with ON/OFF of the function key, in the fifth invention the user can temporarily change the character input mode to the alphabet input mode by continuously touching the alphabet key without changing the character input mode. As a result, the user can easily input the alphabet during the input operation of the data in the kana input mode to the data processor by merely touching the alphabet shift key, and can thus improve input efficiency.

Finally, a keyboard 4 that can be used for the present invention and can input romaji codes will be explained.

Figure 12:
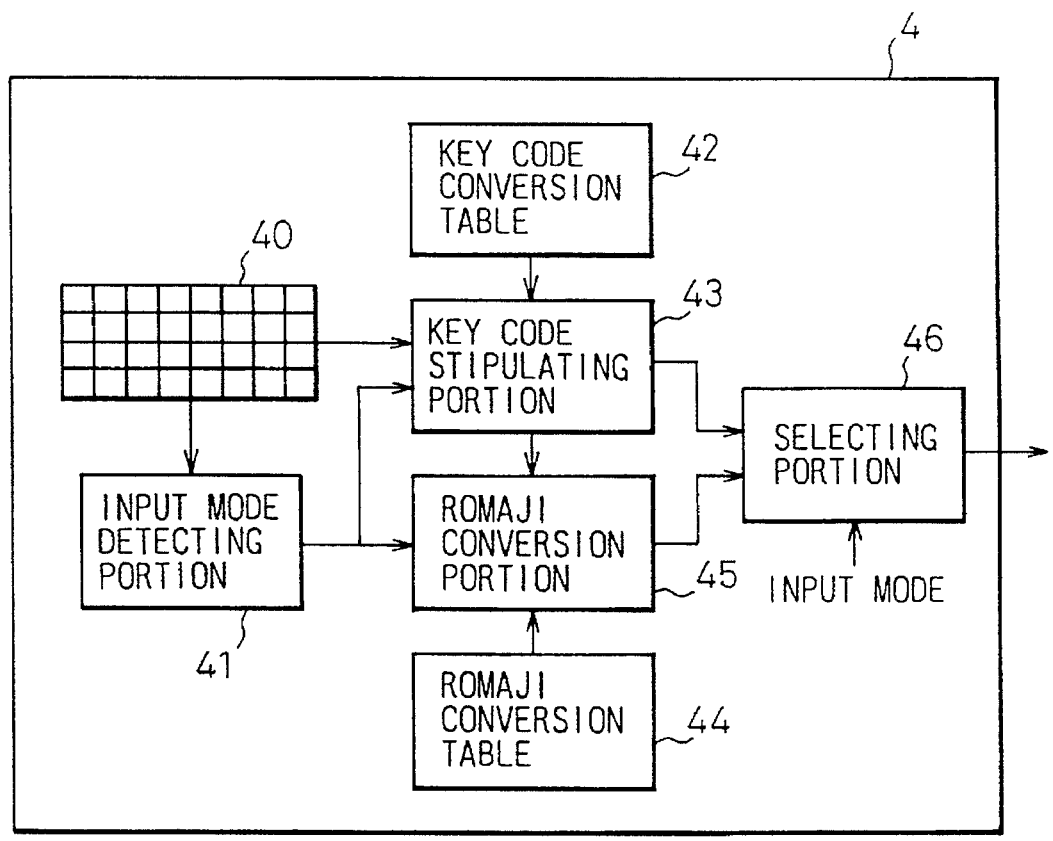
FIG. 12 is a block circuit diagram showing the internal construction of an example of the keyboard equipped with the alphabet conversion function according to the present invention.

FIG. 12 shows an embodiment of the keyboard 4 capable of inputting romaji codes. In the drawing, reference numeral 40 denotes a key switch, 41 is an input mode detecting portion, 42 is a key-code conversion table, 43 is a key-code specifying portion, 44 is a romaji conversion table, 45 is a romaji converting portion and 46 is a selecting portion.

The input mode detecting portion 41 detects the operation of the key switch 40, and detects whether the data processor is set to the kana input mode, the alphabet input mode or the romaji input mode. The key-code converting table 42 manages the correspondence between the key address and the key-code generated by the key switch 40. The key-code specifying portion 43 specifies the key-code inputted by using the management data of the key-code conversion table 42 when the key switch 40 generates the key address. The romaji conversion table 44 manages the correspondence between romaji and kana, and the romaji converting portion 45 converts the romaji specified by the key-code specifying portion 43 by using the management data of the romaji conversion table 44 when the input mode is set to the romaji conversion mode. When the input mode is set to the kana input mode and the alphabet input mode, the selecting portion 46 selects and outputs the key-code specified by the key-code specifying portion 43, and when the input mode is set to the romaji conversion mode, it selects and outputs the key-code of the kana outputted by the romaji converting portion 45.

As illustrated in this embodiment, the romaji input keyboard 4 used for the present invention is equipped with the romaji conversion function for converting the romaji (alphabet) inputted from the key switch 40 of the keyboard in place of the data processor 1. In other words, when the key having the letter "K" assigned thereto is touched while the input mode is set to the alphabet input mode, the keyboard 4 outputs the key-code of the letter "K", but when the input mode is set to the romaji conversion mode, on the other hand, it waits for the input next to the alphabet "K" and then outputs the key-code of the hiragana or the katakana. For example, when the combination of alphabet characters are inputted in the hiragana input mode as shown in FIG. 19C, corresponding key-code for hiragana as shown in FIG. 19A is outputted. Contrary to this, when the combination of alphabet characters are inputted in the katakana input mode as shown in FIG. 19C, corresponding key-code for katakana as shown in FIG. 19B is outputted.

As can be clearly understood from the various foregoing embodiments explained above, the present invention can send the correct key-code required by the data processing program to the data processing program when the key arrangement of the keyboard connected to the data processor is different from the key arrangement assumed by the data processing program. Furthermore, according to the present invention, a keyboard having a romaji conversion function can be connected to the data processor.

What is claimed is:

1. A key-code outputting apparatus for outputting key information from a keyboard to a data processing means as a key-code, the keyboard having a plurality of different character input modes and a key arrangement of the keyboard is different from a key arrangement assumed by the data processing means of a data processor, comprising:

keyboard kind judging means for judging a kind of key arrangement of the keyboard presently used;

character input mode detection means for detecting a present character input mode set to the data processor;

corresponding code memory means for storing the key information of the keyboard and the key-code corresponding to the key information in the key arrangement assumed by the data processing means in a predetermined character input mode with a corresponding form;

key-code generation means for generating a key-code corresponding to the key information from the keyboard referring to the corresponding code memory when the detected present character input mode is the predetermined character input mode; and a display apparatus provided for the data processor and the character input mode detection means detecting the character input mode or a shift mode by referring to the information stored in a specific area of a display memory for storing a display data of the display apparatus.

2. A key-code outputting apparatus for outputting key information from a keyboard to a data processing means as a key-code, the keyboard having a plurality of different character input modes and a key arrangement of the keyboard is different from a key arrangement assumed by the data processing means of a data processor, comprising:

keyboard kind judging means for judging a kind of key arrangement of the keyboard presently used;

character input mode detection means for detecting a present character input mode set to the data processor;

corresponding code memory means for storing the key information of the keyboard and the key-code corresponding to the key information in the key arrangement assumed by the data processing means in a predetermined character input mode with a corresponding form;

key-code generation means for generating a key-code corresponding to the key information from the keyboard referring to the corresponding code memory when the detected present character input mode is the predetermined character input mode; and the character input mode detection means detects the character input mode or a shift mode from a content of a mode changing command at every issuance of the mode changing command.

3. A key-code outputting apparatus according to claim 2, wherein a display apparatus is provided for the data processor for displaying the character input mode or the shift mode stored in the specific area of the display memory for storing a display data of the display apparatus as the mode changing command.

4. A key-code outputting apparatus for outputting key information from a keyboard to a data processing means as a key-code, the keyboard having a plurality of different character input modes and a key arrangement of the keyboard is different from a key arrangement assumed by the data processing means of a data processor, comprising:

keyboard kind judging means for judging the kind of key arrangement of the keyboard presently used and the keyboard kind judging means judging the kind of the keyboard by a disposition of pins provided in a connector for the keyboard;

character input mode detection means for detecting present character input mode set to the data processor;

corresponding code memory means for storing the key information of the keyboard and the key-code corresponding to the key information in the key arrangement assumed by the data processing means in a predetermined character input mode with a corresponding form; and key-code generation means for generating a key-code corresponding to the key information from the keyboard referring to the corresponding code memory when the detected present character input mode is the predetermined character input mode.

5. A key-code outputting apparatus for outputting key information from a keyboard to a data processing means as a key-code, the keyboard having a plurality of different character input modes and a key arrangement of the keyboard is different from a key arrangement assumed by the data processing means of a data processor, comprising:

keyboard kind judging means for judging a kind of key arrangement of the keyboard presently used;

character input mode detection means for detecting a present character input mode set to the data processor;

corresponding code memory means for storing the key information of the keyboard and the key-code corresponding to the key information in the key arrangement assumed by the data processing means in a predetermined character input mode with a corresponding form;

key-code generation means for generating a key-code corresponding to the key information from the keyboard referring to the corresponding code memory when the detected present character input mode is the predetermined character input mode; and the keyboard being equipped with a matrix circuit corresponding to keys on the keyboard, a non-key corresponding circuit corresponding to a key not existing on the keyboard disposed in the matrix circuit, a short-circuit position of the non-key corresponding circuit is different with the kind of the keyboard, and the keyboard kind judging means judges the kind of the keyboard from the short-circuit position of the non-key corresponding circuit of the keyboard under a state where none of the keys of the keyboard are touched.

6. A key-code outputting apparatus for outputting key information from a keyboard to a data processing means as a key-code, the keyboard having a plurality of different character input modes and a key arrangement of the keyboard is different from a key arrangement assumed by the data processing means of a data processor, comprising:

keyboard kind judging means for judging a kind of key arrangement of the keyboard presently used;

character input mode detection means for detecting a present character input mode set to the data processor;

corresponding code memory means for storing the key information of the keyboard and the key-code corresponding to the key information in the key arrangement assumed by the data processing means in a predetermined character input mode with a corresponding form;

key-code generation means for generating a key-code corresponding to the key information from the keyboard referring to the corresponding code memory when the detected present character input mode is the predetermined character input mode; and the keyboard for outputting the key-code to a data processing function developed in the data processor being equipped with:

a romaji mode detection means for detecting whether or not the character input mode is set to a romaji input mode; and a conversion means for handling the letters inputted from the keyboard as a romaji and converting them to a hiragana when a romaji input mode is detected, outputting its key-code to the data processor, and when the character input mode is not detected as the romaji input mode, outputting as such key-code corresponding to the alphabet inputted from the keyboard to the data processor.

7. A key-code outputting apparatus for outputting key information from a keyboard to a data processing means as a key-code, a key arrangement of the keyboard is different from a key arrangement assumed by the data processing means of a data processor and the key information outputted from the keyboard by touching a key to input a certain character is corresponding to a key information outputted by touching a different key having a different key-position and a shift key at the same time in the key arrangement assumed by the data processing means, comprising:

keyboard kind judgement means for judging a kind of the key arrangement of the keyboard connected at present to the data processor;

shift mode detection means for detecting whether the keyboard connected to the data processor is in a shift mode or an unshifted mode;

key-code memory means disposed for the keyboard assumed by the data processing means, for storing the key-code so outputted as to the key information at the time when the key is touched under he unshift state, in an unshift region, and for storing the key-code so outputted as to correspond to the key information at the time when the key is touched under the shift state as the combination of the key-code outputted when the same key is under the unshift state with the key-code representing the shift, in the shift region;

corresponding code memory means so disposed as to correspond to a keyboard having a different key arrangement from the keyboard assumed by the data processing means, for storing the kind of the key arrangement of the keyboard and the key-code in the key arrangement assumed by the data processing means and corresponding to the kind of characters represented by the key information for the key information inputted from the keyboard for both the unshifted mode and the shift mode at that time;

key-code conversion means for reading the key-code from the key-code memory means in accordance with the present shift mode when the keyboard being used at present is the one assumed by the data processing means, reading the key-code from the corresponding code memory means when the keyboard has a different kind of key arrangement from that of the keyboard assumed by the data processing means, and outputting the key-code to the data processing means; and a display apparatus provided for the data processor and the character input mode detection means detects the character input mode or a shift mode by referring to code information stored in a specific area of a display memory for storing a display data of the display apparatus.

8. A key-code outputting apparatus for outputting key information from a keyboard to a data processing means as a key-code, a key arrangement of the keyboard is different from a key arrangement assumed by the data processing means of a data processor and the key information outputted from the keyboard by touching a key to input a certain character is corresponding to a key information outputted by touching a different key having a different key-position and a shift key at the same time in the key arrangement assumed by the data processing means, comprising:

keyboard kind judgement means for judging a kind of the key arrangement of the keyboard connected at present to the data processor;

shift mode detection means for detecting whether the keyboard connected to the data processor is in a shift mode or an unshifted mode;

key-code memory means disposed for the keyboard assumed by the data processing means, for storing the key-code so outputted as to the key information at the time when the key is touched under the unshift state, in an unshift region, and for storing the key-code so outputted as to correspond to the key information at the time when the key is touched under the shift state as the combination of the key-code outputted when the same key is under the unshift state with the key-code representing the shift, in the shift region;

corresponding code memory means so disposed as to correspond to a keyboard having a different key arrangement from the keyboard assumed by the data processing means, for storing the kind of the key arrangement of the keyboard and the key-code in the key arrangement assumed by the data processing means and corresponding to the kind of characters represented by the key information for the key information inputted from the keyboard for both the unshifted mode and the shift mode at that time;

key-code conversion means for reading the key-code from the key-code memory means in accordance with the present shift mode when the keyboard being used at present is the one assumed by the data processing means, reading the key-code from the corresponding code memory means when the keyboard has a different kind of key arrangement from that of the keyboard assumed by the data processing means, and outputting the key-code to the data processing means; and the character input mode detection means detects the character input mode or a shift mode from a content of a mode changing command at every issuance of the mode changing command.

9. A key-code outputting apparatus according to claim 8, wherein a display apparatus is provided for the data processor for displaying the character input mode or the shift mode stored in the specific area of the display memory for storing a display data of the display apparatus as the mode changing command.

10. A key-code outputting apparatus for outputting key information from a keyboard to a data processing means as a key-code, a key arrangement of the keyboard is different from a key arrangement assumed by the data processing means of a data processor and the key information outputted from the keyboard by touching a key to input a certain character is corresponding to a key information outputted by touching a different key having a different key-position and a shift key at the same time in the key arrangement assumed by the data processing means, comprising:

keyboard kind judgement means for judging a kind of the key arrangement of the keyboard connected at present to the data processor;

shift mode detection means for detecting whether the keyboard connected to the data processor is in a shift mode or an unshifted mode;

key-code memory means disposed for. the keyboard assumed by the data processing means, for storing the key-code so outputted as to the key information at the time when the key is touched under the unshift state, in an unshift region, and for storing the key-code so outputted as to correspond to the key information at the time when the key is touched under the shift state as the combination of the key-code outputted when the same key is under the unshift state with the key-code representing the shift, in the shift region, and a display apparatus is provided to the data processor and the character input mode detection means detects the character input mode or a shift mode by referring to code information stored in a specific area of a display memory for storing a display data of the display apparatus.

11. A key-code outputting apparatus according to claim 10, wherein the character input mode detection means refers to the code information stored in a specific area of the display memory at every issuance of the key information from the keyboard.

12. A key-code outputting apparatus for outputting key information from a keyboard to a data processing means as a key-code, a key arrangement of the keyboard is different from a key arrangement assumed by the data processing means of a data processor and the key information outputted from the keyboard by touching a key to input a certain character is corresponding to a key information outputted by touching a different key having a different key-position and a shift key at the same time in the key arrangement assumed by the data processing means, comprising:

keyboard kind judgement means for judging a kind of the key arrangement of the keyboard connected at present to the data processor;

shift mode detection means for detecting whether the keyboard connected to the data processor is in a shift mode or an unshifted mode;

key-code memory means disposed for the keyboard assumed by the data processing means, for storing the key-code so outputted as to the key information at the time when the key is touched under the unshift state, in an unshift region, and for storing the key-code so outputted as to correspond to the key information at the time when the key is touched under the shift state as the combination of the key-code outputted when the same key is under the unshift state with the key-code representing the shift, in the shift region; the character input mode detection means detects the character input mode or a shift mode from a content of a mode changing command at every issuance of the mode changing command.

13. A key-code outputting apparatus according to claim 12, wherein a display apparatus is provided for the data processor for displaying the character input mode or the shift mode stored in the specific area of the display memory for storing a display data of the display apparatus as the mode changing command.

14. A key-code outputting apparatus for outputting key information from a keyboard to a data processing means as a key-code, a key arrangement of the keyboard is different from a key arrangement assumed by the data processing means of a data processor and the key information outputted from the keyboard by touching a key to input a certain character is corresponding to a key information outputted by touching a different key having a different key-position and a shift key at the same time in the key arrangement assumed by the data processing means, comprising:

keyboard kind judgement means for judging a kind of the key arrangement of the keyboard connected at present to the data processor; and the keyboard kind judging means judging the kind of the keyboard by the disposition of pins provided in a connector for the keyboard;

shift mode detection means for detecting whether the keyboard connected to the data processor is in a shift mode or an unshifted mode;

key-code memory means disposed for the keyboard assumed by the data processing means, for storing the key-code so outputted as to the key information at the time when the key is touched under the unshift state, in an unshift region, and for storing the key-code so outputted as to correspond to the key information at the time when the key is touched under the shift state as the combination of the key-code outputted when the same key is under the unshift state with the key-code representing the shift, in the shift region.

15. A key-code outputting apparatus for outputting key information from a keyboard to a data processing means as a key-code, a key arrangement of the keyboard is different from a key arrangement assumed by the data processing means of a data processor and the key information outputted from the keyboard by touching a key to input a certain character is corresponding to a key information outputted by touching a different key having a different key-position and a shift key at the same time in the key arrangement assumed by the data processing means, comprising:

keyboard kind judgement means for judging a kind of the key arrangement of the keyboard connected at present to the data processor;

shift mode detection means for detecting whether the keyboard connected to the data processor is in a shift mode or an unshifted mode;

key-code memory means disposed for the keyboard assumed by the data processing means, for storing the key-code so outputted as to the key information at the time when the key is touched under the unshift state, in an unshift region, and for storing the key-code so outputted as to correspond to the key information at the time when the key is touched under the shift state as the combination of the key-code outputted when the same key is under the unshift state with the key-code representing the shift, in the shift region; and the keyboard is equipped with a matrix circuit corresponding to keys on the keyboard, a non-key corresponding circuit corresponding to a key not existing on the keyboard is disposed in the matrix circuit, a short-circuit position of the non-key corresponding circuit is different with the kind of the keyboard, and the keyboard kind judging means judges the kind of the keyboard from the short-circuit position of the non-key corresponding circuit of the keyboard under a state where none of the keys of the keyboard are touched.

16. A key-code outputting apparatus for outputting key information from a keyboard to a data processing means as a key-code, a key arrangement of the keyboard is different from a key arrangement assumed by the data processing means of a data processor and the key information outputted from the keyboard by touching a key to input a certain character is corresponding to a key information outputted by touching a different key having a different key-position and a shift key at the same time in the key arrangement assumed by the data processing means, comprising:

keyboard kind judgement means for judging a kind of the key arrangement of the keyboard connected at present to the data processor;

shift mode detection means for detecting whether the keyboard connected to the data processor is in a shift mode or an unshifted mode;

key-code memory means disposed for the keyboard assumed by the data processing means, for storing the key-code so outputted as to the key information at the time when the key is touched under the unshift state, in an unshift region, and for storing the key-code so outputted as to correspond to the key information at the time when the key is touched under the shift state as the combination of the key-code outputted when the same key is under the unshift state with the key-code representing the shift, in the shift region;

the keyboard for outputting the key-code to a data processing function developed in the data processor is equipped with:

a romaji mode detection means for detecting whether or not the character input mode is set to the romaji input mode; and a conversion means for handling the letters inputted from the keyboard as a romaji and converting them to a hiragana when a romaji input mode is detected, outputting its key-code to the data processor, and when the character input is not detected as the romaji input mode, outputting as such key-code corresponding to the alphabet inputted from the keyboard to the data processor.

17. A key-code outputting apparatus for outputting a key information from a keyboard to a data processing means as a key-code, the keyboard having a plurality of different character input mode, a key arrangement of the keyboard is different from a key arrangement assumed by the data processing means of a data processor, and a specific key is used for inputting the same character in a different character input mode, comprising:

keyboard kind judging means for judging a kind of key arrangement of the keyboard presently used;

key-code memory means for storing a key-code for changing the present character input mode to a predetermined character input mode wherein the specific key is used in the key arrangement assumed by the data processing means and a key-code generated by the touch of the specific key in the predetermined character input mode, in accordance with the key information outputted from the keyboard by the touch of the specific key, the key-code memory means is equipped with a return key-code for returning the predetermined character input mode to a previous character input mode, and the key-code generation means outputs the return key-code successively to the key-code of the character input mode, and key code of the character; and key-code generation means for outputting a key-code of character indicated by the specific key in the predetermined character input mode and the key-code of the character input mode corresponding to the key information after referring to the key-code memory means in accordance with the received key information.

18. A key-code outputting apparatus for outputting key information from a keyboard to a data processing means as a key-code, the keyboard having a plurality of different character input mode, a key arrangement of the keyboard is different from a key arrangement assumed by the data processing means of a data processor, and a specific key is used for inputting the same character in a different character input mode, comprising:

keyboard kind judging means for judging a kind of key arrangement of the keyboard presently used and judging the kind of the keyboard by the disposition of pins provided in a connector for the keyboard;

key-code memory means for storing a key-code for changing the present character input mode to a predetermined character input mode wherein the specific key is used in the key arrangement assumed by the data processing means and a key-code generated by the touch of the specific key in the predetermined character input mode, in accordance with the key information outputted from the keyboard by the touch of the specific key; and key-code generation means for outputting a key-code of character indicated by the specific key in the predetermined character input mode and the key-code of the character input mode corresponding to the key information after referring to the key-code memory means in accordance with the received key information.

19. A key-code outputting apparatus for outputting key information from a keyboard to a data processing means as a key-code, the keyboard having a plurality of different character input mode, a key arrangement of the keyboard is different from a key arrangement assumed by the data processing means of a data processor, and a specific key is used for inputting the same character in a different character input mode, comprising:

keyboard kind judging means for judging a kind of key arrangement of the keyboard presently used;

key-code memory means for storing a key-code for changing the present character input mode to a predetermined character input mode wherein the specific key is used in the key arrangement assumed by the data processing means and a key-code generated by the touch of the specific key in the predetermined character input mode, in accordance with the key information outputted from the keyboard by the touch of the specific key;

key-code generation means for outputting a key-code of character indicated by the specific key in the predetermined character input mode and the key-code of the character input mode corresponding to the key information after referring to the key-code memory means in accordance with the received key information;

the keyboard being equipped with a matrix circuit corresponding to each keys on the keyboard, a non-key corresponding circuit corresponding to a key not existing on the keyboard is disposed in the matrix circuit, a short-circuit position of the non-key corresponding circuit is different with the kind of the keyboard, and the keyboard kind judging means judges the kind of the keyboard from the short-circuit position of the non-key corresponding circuit of the keyboard under a state where none of the keys of the keyboard are touched.

20. A key-code outputting apparatus for outputting key information from a keyboard to a data processing means as a key-code, the keyboard having a plurality of different character input mode, a key arrangement of the keyboard is different from a key arrangement assumed by the data processing means of a data processor, and a specific key is used for inputting the same character in a different character input mode, comprising:

keyboard kind judging means for judging a kind of key arrangement of the keyboard presently used;

key-code memory means for storing a key-code for changing the present character input mode to a predetermined character input mode wherein the specific key is used in the key arrangement assumed by the data processing means and a key-code generated by the touch of the specific key in the predetermined character input mode, in accordance with the key information outputted from the keyboard by the touch of the specific key;

key-code generation means for outputting a key-code of character indicated by the specific key in the predetermined character input mode and the key-code of the character input mode corresponding to the key information after referring to the key-code memory means in accordance with the received key information;

the keyboard for outputting the key-code to a data processing function developed in the data processor is equipped with:

a romaji mode detection means for detecting whether or not the character input mode is set to the romaji input mode; and a conversion means for handling the letters inputted from the keyboard as a romaji and converting them to a hiragana when a romaji input mode is detected, outputting its key-code to the data processor, and the character input is not detected as the romaji input mode, outputting as such key-code corresponding to the alphabet inputted from the keyboard to the data processor.

21. A key-code outputting apparatus for outputting a key information from a keyboard to a data processing means as a key-code, the keyboard having a plurality of different character input mode, a key arrangement of the keyboard is different from a key arrangement assumed by the data processing means of a data processor, and a specific key is used for inputting the same character in a different character input mode, comprising:

keyboard kind judging means for judging the kind of key arrangement of the keyboard presently used;

first key-code memory means for storing a key-code generated by the touch of a function key for changing the present character input mode to a predetermined character input mode wherein the specific key is used in the key arrangement assumed by the data processing means, a key-code generated by the release of the function key, and a key-code generated by the touch of the specific key in the predetermined character input mode, in accordance with the key information outputted from the keyboard by the touch of the specific key;

second key-code memory means for storing a key-code generated by the touch of the function key for changing the present character input mode to a specific character input mode other than predetermined character input mode wherein the specific key is used in the key arrangement assumed by the data processing means and a key-code generated by the touch of the specific key in the predetermined character input mode, in accordance with the key information outputted from the keyboard by the touch of the specific key; and key-code interrupt generation means for interruptedly generating a key-code at a predetermined time interval, and the key-code is generated by the touch of the specific key when the key information showing a on-state of the key is continuously inputted for more than a predetermined time.

22. A key-code outputting apparatus according to claim 21, wherein the keyboard kind judging means judges the kind of the keyboard by the disposition of pins provided in a connector for the keyboard.

23. A key-code outputting apparatus according to claim 21, wherein the keyboard is equipped with a matrix circuit corresponding to each keys on the keyboard, a non-key corresponding circuit corresponding to a key not existing on the keyboard is disposed in the matrix circuit, a short-circuit position of the non-key corresponding circuit is different with the kind of the keyboard, and the keyboard kind judging means judges the kind of the keyboard from the short-circuit position of the non-key corresponding circuit of the keyboard under the state where none of the keys of the keyboard are touched.

24. A key-code outputting apparatus according to claim 21, wherein the character input mode detection means is disposed on the side of the data processor, and means other than the character input mode detection means are disposed on the side of the keyboard.

25. A key-code outputting apparatus according to claim 21, wherein the keyboard for outputting the key-code to a data processing function developed in the data processor is equipped with:

a romaji mode detection means for detecting whether or not the character input mode is set to the romaji input mode; and a conversion means for handling the letters inputted from the keyboard as a romaji and converting them to a hiragana when a romaji input mode is detected, outputting its key-code to the data processor, and when the character input is not detected as the romaji input mode, outputting as such key-code corresponding to the alphabet inputted from the keyboard to the data processor.

26. A key-code outputting apparatus for outputting key information from a keyboard to a data processing means as a key-code, the keyboard having a plurality of different character input mode and a key arrangement of the keyboard is different from a key arrangement of the keyboard is different from a key arrangement assumed by the data processing means of a data processor, comprising:

keyboard kind judging means for judging a kind of key arrangement of the keyboard presently used and the keyboard kind judging means judging the kind of the keyboard by the disposition of pins provided in a connector for the keyboards;

shift key provided on the keyboard capable of temporarily changing the first character input mode to the second character input mode;

first key-code memory means for storing a key-code generated by the touch of the function key for changing the present character input mode to the second character input mode in accordance with the key information showing a touch operation of the shift key and a key-code generated by the release of the function key; and second key-code memory for storing a key-code generated by the touch of the function key for changing the present character input mode to the first character input mode and a key-code generated when the function key is release, in accordance with the key information showing the release of the shift-key.

27. A key-code outputting apparatus for outputting key information from a keyboard to a data processing means as a key-code, the keyboard having a plurality of different character input mode and a key arrangement of the keyboard is different from a key arrangement of the keyboard is different from a key arrangement assumed by the data processing means of a data processor, comprising:

keyboard kind judging means for judging a kind of key arrangement of the keyboard presently used:

shift key provided on the keyboard capable of temporarily changing the first character input mode to the second character input mode;

first key-code memory means for storing a key-code generated by the touch of the function key for changing the present character input mode to the second character input mode in accordance with the key information showing a touch operation of the shift key and a key-code generated by the release of the function key;

second key-code memory for storing a key-code generated by the touch of the function key for changing the present character input mode to the first character input mode and a key-code generated when the function key is release, in accordance with the key information showing the release of the shift-key;

the keyboard is equipped with a matrix circuit corresponding to each keys on the keyboard, a non-key corresponding circuit corresponding to a key not existing on the keyboard is disposed in the matrix circuit, a short-circuit position of the non-key corresponding circuit is different with the kind of the keyboard, and the keyboard kind judging means judges the kind of the keyboard from the short-circuit position of the non-key corresponding circuit of the keyboard under the state where none of the keys of the keyboard are touched.

28. A key-code outputting apparatus for outputting key information from a keyboard to a data processing means as a key-code, the keyboard having a plurality of different character input mode and a key arrangement of the keyboard is different from a key arrangement of the keyboard is different from a key arrangement assumed by the data processing means of a data processor, comprising:

keyboard kind judging means for judging a kind of key arrangement of the keyboard presently used:

shift key provided on the keyboard capable of temporarily changing the first character input mode to the second character input mode;

first key-code memory means for storing a key-code generated by the touch of the function key for changing the present character input mode to the second character input mode in accordance with the key information showing a touch operation of the shift key and a key-code generated by the release of the function key;

second key-code memory for storing a key-code generated by the touch of the function key for changing the present character input mode to the first character input mode and a key-code generated when the function key is release, in accordance with the key information showing the release of the shift-key;

the keyboard for outputting the key-code to a data processing function developed in the data processor is equipped with:

a romaji mode means for detecting whether or not the character input mode is set to the romaji input mode; and a conversion means for handling the letters inputted from the keyboard as a romaji input mode is detected, outputting its key-code to the data processor, and when the character input is not detected as the romaji input mode, outputting as such key-code corresponding to the alphabet inputted from the keyboard to the data processor.

* * * * *